United States Patent
Park

(10) Patent No.: US 10,147,495 B2
(45) Date of Patent: Dec. 4, 2018

(54) NONVOLATILE MEMORY DEVICE GENERATING LOOP STATUS INFORMATION, STORAGE DEVICE INCLUDING THE SAME, AND OPERATING METHOD THEREOF

(71) Applicant: Samsung Electronics Co., Ltd., Suwon-si, Gyeonggi-do (KR)

(72) Inventor: Sang-Soo Park, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/664,180

(22) Filed: Jul. 31, 2017

(65) Prior Publication Data

US 2018/0151236 A1 May 31, 2018

(30) Foreign Application Priority Data

Nov. 30, 2016 (KR) .......................... 10-2016-0162126

(51) Int. Cl.
| | |
|---|---|
| *G11C 16/04* | (2006.01) |
| *G11C 16/34* | (2006.01) |
| *G11C 16/08* | (2006.01) |
| *G11C 16/10* | (2006.01) |
| *G11C 16/24* | (2006.01) |

(Continued)

(52) U.S. Cl.
CPC .......... *G11C 16/3459* (2013.01); *G11C 16/08* (2013.01); *G11C 16/10* (2013.01); *G11C 16/24* (2013.01); *G11C 16/28* (2013.01); *G11C 16/30* (2013.01)

(58) Field of Classification Search
CPC ............ G11C 11/5678; G11C 11/5685; G11C 13/0004; G11C 13/0007; G11C 13/0064; G11C 13/0069; G11C 13/0097; G11C 16/3413; G11C 16/3463; G11C 2013/0073; G11C 2013/0092; G11C 2213/11; G11C 2213/31; G11C 2213/34
USPC ....... 714/37, 46, 47.3, 724, E11.173, 39, 44, 714/472, 49, 51, 770, 779; 365/148, 163, 365/189.011, 48
See application file for complete search history.

(56) References Cited

U.S. PATENT DOCUMENTS

| | | |
|---|---|---|
| 7,679,133 B2 | 3/2010 | Son et al. |
| 7,995,393 B2 | 8/2011 | Kim et al. |
| 8,054,691 B2 | 11/2011 | Hemink |

(Continued)

*Primary Examiner* — Thong Q Le
(74) *Attorney, Agent, or Firm* — Harness, Dickey & Pierce, P.L.C.

(57) ABSTRACT

A nonvolatile memory device includes a cell array comprising memory cells; a voltage generator that provides a program or verification voltage to a word line of memory cells selected from the memory cells; a page buffer that transfers write data to be programmed in the selected memory cells through bit lines and to sense whether the selected memory cells are programmed to target states, based on the verification voltage; and a control logic that controls the voltage generator such that the program voltage and the verification voltage are provided to the word line in units of multiple loops during a program operation, the control logic including a loop status circuit that detects values of state pass loops associated with the target states from a sensing result of the page buffer and determines whether the program operation is successful, based on the values of the state pass loops.

20 Claims, 22 Drawing Sheets

(51) Int. Cl.
*G11C 16/28* (2006.01)
*G11C 16/30* (2006.01)

(56) References Cited

U.S. PATENT DOCUMENTS

| | | |
|---|---|---|
| 8,305,807 B2 | 11/2012 | Shah et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,675,416 B2 | 3/2014 | Lee |
| 8,811,089 B2 | 8/2014 | Ueno |
| 9,225,356 B2 | 12/2015 | Mu et al. |
| 2006/0026471 A1* | 2/2006 | Kubota ................ H04L 12/437 714/724 |
| 2011/0233648 A1 | 9/2011 | Seol et al. |
| 2012/0020166 A1 | 1/2012 | Ishii |
| 2016/0148695 A1 | 5/2016 | Kim |

* cited by examiner

FIG. 8

| State | Verify Loop | | 1ST E-Fuse Latch | | 2ND E-Fuse Latch | | Loop Status |
|---|---|---|---|---|---|---|---|
| | SPL | DL | SPL Min | SPL Max | Delta Min | Delta Max | |
| P1 | 7 | - | 6 | 8 | - | - | Pass |
| P2 | 10 | 3 | 9 | 11 | 2 | 4 | Pass |
| P3 | 13 | 3 | 12 | 14 | 2 | 4 | Pass |
| P4 | 16 | 3 | 15 | 17 | 2 | 4 | Pass |
| P5 | 19 | 3 | 18 | 20 | 2 | 4 | Pass |
| P6 | 22 | 3 | 21 | 23 | 2 | 4 | Pass |
| P7 | 25 | 3 | 24 | - | 2 | 4 | Pass |
| | | | Loop Status Decision | | | | Pass |

FIG. 9A

| State | Verify Loop | | 1ST E-Fuse Latch | | 2ND E-Fuse Latch | | Loop Status |
|---|---|---|---|---|---|---|---|
| | SPL | DL | SPL Min | SPL Max | Delta Min | Delta Max | |
| P1 | 7 | - | 6 | 8 | - | - | Pass |
| P2 | 11 | 4 | 9 | 11 | 2 | 4 | Pass |
| P3 | 12 | 1 | 12 | 14 | 2 | 4 | Fail |
| P4 | 16 | 4 | 15 | 17 | 2 | 4 | Pass |
| P5 | 19 | 3 | 18 | 20 | 2 | 4 | Pass |
| P6 | 22 | 3 | 21 | 23 | 2 | 4 | Pass |
| P7 | 25 | 3 | 24 | - | 2 | 4 | Pass |
| Loop Status Decision | | | | | | | Fail |

FIG. 9B

| State | Verify Loop | | 1ST E-Fuse Latch | | 2ND E-Fuse Latch | | Loop Status |
|---|---|---|---|---|---|---|---|
| | SPL | DL | SPL Min | SPL Max | Delta Min | Delta Max | |
| P1 | 7 | - | 6 | 8 | - | - | Pass |
| P2 | 9 | 2 | 9 | 11 | 2 | 4 | Pass |
| P3 | 14 | 5 | 12 | 14 | 2 | 4 | Fail |
| P4 | 16 | 2 | 15 | 17 | 2 | 4 | Pass |
| P5 | 19 | 3 | 18 | 20 | 2 | 4 | Pass |
| P6 | 22 | 3 | 21 | 23 | 2 | 4 | Pass |
| P7 | 25 | 3 | 24 | - | 2 | 4 | Pass |
| Loop Status Decision | | | | | | | Fail |

FIG. 9C

| State | Verify Loop | | 1ST E-Fuse Latch | | 2ND E-Fuse Latch | | Loop Status |
|---|---|---|---|---|---|---|---|
| | SPL | DL | SPL Min | SPL Max | Delta Min | Delta Max | |
| P1 | 7 | - | 6 | 8 | - | - | Pass |
| P2 | 10 | 3 | 9 | 11 | 2 | 4 | Pass |
| P3 | 12 | 2 | 12 | 14 | 2 | 4 | Pass |
| P4 | 14 | 2 | 15 | 17 | 2 | 4 | Fail |
| P5 | 18 | 4 | 18 | 20 | 2 | 4 | Pass |
| P6 | 22 | 4 | 21 | 23 | 2 | 4 | Pass |
| P7 | 25 | 3 | 24 | - | 2 | 4 | Pass |
| | | | Loop Status Decision | | | | Fail |

FIG. 9D

| State | Verify Loop | | 1ST E-Fuse Latch | | 2ND E-Fuse Latch | | Loop Status |
|---|---|---|---|---|---|---|---|
| | SPL | DL | SPL Min | SPL Max | Delta Min | Delta Max | |
| P1 | 7 | – | 6 | 8 | – | – | Pass |
| P2 | 10 | 3 | 9 | 11 | 2 | 4 | Pass |
| P3 | 14 | 4 | 12 | 14 | 2 | 4 | Pass |
| P4 | 18 | 4 | 15 | 17 | 2 | 4 | Fail |
| P5 | 20 | 2 | 18 | 20 | 2 | 4 | Pass |
| P6 | 22 | 2 | 21 | 23 | 2 | 4 | Pass |
| P7 | 25 | 3 | 24 | – | 2 | 4 | Pass |
| Loop Status Decision | | | | | | | Fail |

FIG. 11

| State | Verify Loop | | 1ST E-Fuse Latch | | 2ND E-Fuse Latch | | Loop Status |
|---|---|---|---|---|---|---|---|
| | SPL | DL | SPL Min | SPL Max | Delta Min | Delta Max | |
| P1 | 7 | - | 6 | 8 | - | - | Pass |
| P4 | 16 | 9 | 15 | 17 | 8 | 10 | Pass |
| P7 | 25 | 9 | 24 | - | 8 | 10 | Pass |
| Loop Status Decision | | | | | | | Pass |

FIG. 13

| State | Verify Loop | | 1ST E-Fuse Latch | | 2ND E-Fuse Latch | | Loop Status |
|---|---|---|---|---|---|---|---|
| | SPL | DL | SPL Min | SPL Max | Delta Min | Delta Max | |
| P1 | 7 | - | 6 | 8 | - | - | Pass |
| P6 | 22 | 15 | 21 | 23 | 14 | 16 | Pass |
| P7 | 25 | 3 | 24 | - | 2 | 4 | Pass |
| Loop Status Decision | | | | | | | Pass |

NONVOLATILE MEMORY DEVICE GENERATING LOOP STATUS INFORMATION, STORAGE DEVICE INCLUDING THE SAME, AND OPERATING METHOD THEREOF

CROSS-REFERENCE TO RELATED APPLICATIONS

A claim for priority under 35 U.S.C. § 119 is made to Korean Patent Application No. 10-2016-0162126 filed Nov. 30, 2016, in the Korean Intellectual Property Office, the entire contents of which are hereby incorporated by reference.

BACKGROUND

At least some example embodiments of the inventive concepts relate to a semiconductor memory device, and more particularly, a nonvolatile memory device that generates loop status information, a storage device including the same, and an operating method thereof.

Semiconductor memory devices are classified into a volatile semiconductor memory device and a nonvolatile semiconductor memory device. The volatile semiconductor memory device is fast in read and write speeds, but it loses data stored therein power is not supplied thereto. In contrast, the nonvolatile semiconductor memory device retains data stored therein even when power is not supplied thereto. For this reason, the nonvolatile semiconductor memory device is used to store information that has to be retained regardless of whether power is supplied thereto.

The nonvolatile semiconductor memory device typically includes a flash memory device. The flash memory device is being used as a voice and image data storage medium of information devices such as a computer, a cellular phone, a smartphone, a personal digital assistant (PDA), a digital camera, a camcorder, a voice recorder, an MP3 player, a handheld PC, a game console, a facsimile, a scanner, and a printer. Technologies for high-capacity, high-speed input/output, and low-power nonvolatile memory devices are being developed to mount the nonvolatile memory device in mobile devices including a smartphone.

Storing data in a nonvolatile memory device includes an operation of writing data in a selected memory area and a status detecting operation of determining whether the writing of the data in the selected memory area is performed normally. If the result of the status detecting operation indicates that the writing of the data in the selected memory area is performed abnormally, the nonvolatile memory device determines the writing as program fail. A memory area (or block) determined as the program fail is processed as a defective block or a bad block.

The status detecting operation includes determining whether the data are programmed within the limited number of program loops. Alternatively, the status detecting operation may be performed through a read operation that uses a specific read level. However, the status detecting operation is limited to block an uncorrectable error in a nonvolatile memory device in which memory cells are programmed to a plurality of target states. The uncorrectable error may be included in stored data due to various noises or a one-time error that is difficult to check through the status detecting operation and occurs during a program operation.

SUMMARY

At least some example embodiments of the inventive concepts provide a nonvolatile memory device that generates loop status information for identifying program fail due to an unintended noise during a program operation, a storage device including the same, and an operating method thereof.

A nonvolatile memory device includes a cell array including a plurality of memory cells; a voltage generator configured to provide a program voltage or a verification voltage to a word line of memory cells selected from the plurality of memory cells; a page buffer configured to transfer write data to be programmed in the selected memory cells through a plurality of bit lines and to sense whether the selected memory cells are programmed to a plurality of target states, based on the verification voltage; and a control logic configured to control the voltage generator such that the program voltage and the verification voltage are provided to the word line in units of a plurality of loops during a program operation, the control logic including a loop status circuit configured to detect values of state pass loops associated with the plurality of target states from a sensing result of the page buffer and determine whether the program operation is successful, based on the values of the state pass loops, each state pass loop being a program loop, from among the plurality of loops, after which program states of one or more memory cells corresponding to that target state associated with the state pass loop have been raised to the target state associated with the state pass loop.

According to at least some example embodiments of the inventive concepts, a storage device includes a nonvolatile memory device configured to, detect values of state pass loops associated with a plurality of target states, and determine a loop status, which indicates whether a program operation of selected memory cells is successful, by using the values of the state pass loops, during the program operation; and a memory controller configured to reassign an address of data programmed in the selected memory cells to another address based on the determined loop status.

According to at least some example embodiments of the inventive concepts, an operating method of a nonvolatile memory device includes programming selected memory cells to a plurality of target states by using a plurality of program loops during a program operation; detecting state pass loops corresponding to the numbers of loops in which the plurality of target states are completely programmed; and comparing the state pass loops and a first allowable range to decide whether at least one of the state pass loops is out of the first allowable range.

According to at least some example embodiments of the inventive concepts, a nonvolatile memory device includes a control logic configured to perform a program operation, the program operation including, raising program states of one or more nonvolatile memory cells of a nonvolatile memory cell array to a target state by applying one or more program loops to the one or more nonvolatile memory cells, determining a state pass loop of the target state, the state pass loop being a program loop, from among the one or more program loops, after which program states of the one or more nonvolatile memory cells have been raised to the target state, and determining whether the program operation failed based on the state pass loop and a first range.

BRIEF DESCRIPTION OF THE FIGURES

The above and other features and advantages of example embodiments of the inventive concepts will become more apparent by describing in detail example embodiments of the inventive concepts with reference to the attached drawings. The accompanying drawings are intended to depict example embodiments of the inventive concepts and should

FIG. 8 is a table illustrating state pass loops and delta loops when loop statuses are decided as pass;

FIGS. 9A to 9D are tables illustrating state pass loops and delta loops when each loop status is decided as fail;

FIG. 11 is a table illustrating a method of deciding a loop status by using pass loops and delta loops of FIG. 10;

FIG. 13 is a table illustrating a method of deciding a loop status by using pass loops and delta loops of FIG. 13;

DETAILED DESCRIPTION

Figure 1:
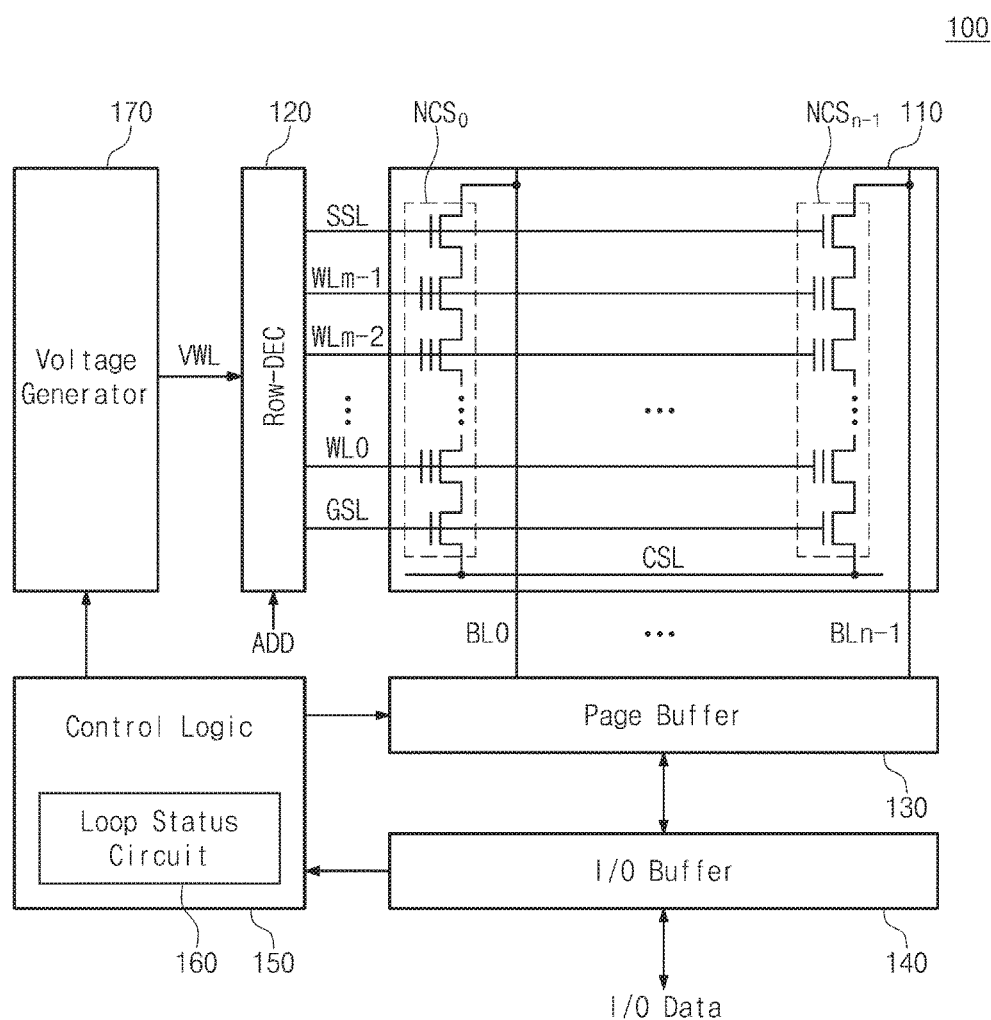
FIG. 1 is a block diagram illustrating a nonvolatile memory device, according to at least one example embodiment of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Below, a NAND flash memory device may be used as an example of a nonvolatile memory device for describing features and functions of at least some example embodiments of the inventive concepts. However, one skilled in the art may easily understand other features and performances from information disclosed herein. For example, a technology disclosed in this specification, according to at least one example embodiment of the inventive concepts, may be used in a phase-change RAM (PRAM), a magnetoresistive RAM (MRAM), a resistive RAM (ReRAM), a ferroelectric RAM (FRAM), a NOR flash memory, etc.

In this specification, various terms for a program operation of a nonvolatile memory device are used. A "program cycle" refers to a unit of a program operation that is needed to program selected memory cells (connected to the same word line) to target states, respectively. A "program loop" is composed of a plurality of operating units constituting the program cycle and includes pulses of a program voltage and a verification voltage. The program cycle may be composed of a plurality of program loops.

In addition, a "target state" used in this specification indicates that threshold voltages of memory cells are within a data identification range. For example, different logical values may be allocated to different threshold voltage ranges, respectively. A program state (or, threshold voltage state) of a memory cell indicates which threshold voltage range, from among the different threshold voltage ranges to which the different logical values are allocated, a threshold voltage of the memory cell falls within. A target state is a program state of a memory cell (or memory cells) that corresponds to the logical value of the data that is intended to be programmed into the memory cell (or memory cells). In addition, the term "status" indicating whether a program operation is successful or is not successful refers to information meaning success or fail of one program cycle. In this specification, terms "program status" and "loop status" may be mentioned. The program status refers to data indicating whether selected memory cells are all programmed, after the maximum or, alternatively, upper threshold program loop is applied. That the program status indicates pass means that data are stored in a selected memory cell through one program cycle. However, that the program status indicates fail means that data are not written normally in a selected memory cell.

The loop status used in this specification refers to information indicating whether each target state is programmed normally. That is, the different numbers of program loops may be applied to program memory cells to target states corresponding to different threshold voltages. Each program state should be programmed within a range of the appropriate number of program loops. However, in the case where at least one of target states is programmed out of a range of the appropriate number of program loops, the loop status may be decided as fail. The loop status refers to information indicating whether programming of each target state is performed successfully.

FIG. 1 is a block diagram illustrating a nonvolatile memory device, according to at least one example embodiment of the inventive concepts. Referring to FIG. 1, the nonvolatile memory device 100 may include a cell array 110, a row decoder 120, a page buffer 130, an input/output buffer 140, control logic 150, a loop status circuit 160, and a voltage generator 170.

The cell array 110 is connected to the row decoder 120 through word lines WL and/or selection lines SSL and GSL. The cell array 110 is connected to the page buffer 130 through bit lines BL0 to BLn-1. The cell array 110 includes a plurality of cell strings $NCS_0$ to $NCS_{n-1}$ formed in a NAND type. The cell strings $NCS_0$ to $NCS_{n-1}$ may constitute a memory block BLK. Here, a channel of each cell string may be formed in a vertical or horizontal direction. The memory cells included in the cell array 110 are programmed by voltages that are provided to a word line and bit lines.

According at least one example embodiment of the inventive concepts, the cell array 110 may be implemented with a three-dimensional (3D) memory array. The 3-dimensional memory array may be monolithically formed in one or more physical level(s) of a memory cell array having an active area arranged on a circuit related on a silicon substrate and an operation of memory cells. The circuit related to an operation of memory cells may be located in a substrate or on a substrate. The term "monolithic" means that layers of each level of the array are directly deposited on the layers of each underlying level of the array.

The row decoder 120 may select one of the memory blocks of the cell array 110 in response to an address ADD. The row decoder 120 may select one of word lines of the selected memory block. The row decoder 120 may transfer a word line voltage VWL from the voltage generator 170 to the selected word line. During a program operation, the row decoder 120 may supply a program/verification voltage to the selected word line and a pass voltage to each of unselected word lines. In the read operation, the row decoder 120 may transfer a selection read voltage Vrd to a selected word line and a non-selection read voltage Vread to an unselected word line.

The page buffer 130 may operate as a write driver in the program operation and as a sense amplifier in the read operation. During the program operation, the page buffer 130 may supply a bit line voltage corresponding to data to be programmed to a bit line of the cell array 110. In the read operation, the page buffer 130 may sense data stored in a selected memory cell through a bit line. The page buffer 130 may latch the sensed data and may output the latched data to the input/output buffer 140.

The input/output buffer 140 may transfer write data received at a program operation to the page buffer 130. The input/output buffer 140 may output data from the page buffer 130 to the outside at a read operation. The input/output buffer 140 may transfer the received address ADD or the received command to the row decoder 120 or the control logic 150.

The control logic 150 may control the page buffer 130 and the voltage generator 170 in response to a command transferred from the outside. The control logic 150 may control the voltage generator 170 and the page buffer 130 in response to a write command such that data from the outside are programmed in selected memory cells. For example, the control logic 150 may program the selected memory cells based on an incremental step pulse programming (ISPP) scheme. In the ISPP scheme, there is performed a program cycle for programming the selected memory cells (e.g., memory cells connected to one word line). One program cycle (or program operation) is composed of a plurality of program loops. In each program loop, at least one program pulse and at least one verification pulse are used. The program pulse is a pulse having a level of a program voltage Vpgm, and the verification pulse is a pulse having a level of a verification voltage Vfy. In the ISPP scheme, a level of the program voltage Vpgm may increase as a loop count increases.

The loop status circuit 160 may check whether memory cells are programmed normally to target states in a program operation, in units of a program loop. The loop status circuit 160 may detect whether programming of a loop unit is successful, with reference to a result of a verification read operation in each program loop, while one program cycle is performed. In the case where any one target state indicates program pass at an abnormal loop count, the loop status circuit 160 may decide the loop status as fail. The loop status may be output to the outside of the nonvolatile memory device by an external request. A detailed example of the loop status circuit 160 will be described with reference to FIG. 2.

The voltage generator 170 may generate various word line voltages VWL to be supplied to word lines and a voltage to be supplied to a bulk (e.g., a well area) in which memory cells are formed, under control of the control logic 150. The word line voltages to be supplied to the word lines include a program voltage (e.g., Vpgm), a pass voltage (e.g., Vpass), selection and non-selection read voltages (e.g., Vrd and Vread), etc. The voltage generator 170 may further generate selection line voltages (e.g., $V_{SSL}$ and $V_{GSL}$) to be provided to the selection lines SSL and GSL during a read operation or a program operation. Also, under control of the control logic 150, the voltage generator 170 may generate a verification voltage Vfy and may provide the verification voltage Vfy to the row decoder 120.

With the above description, the nonvolatile memory device 100 may detect the case where at least one among a plurality of target states is program-completed at an abnormal loop count. The nonvolatile memory device 100 may output the detection result to the outside as the loop status. Accordingly, it may be possible to block an uncorrectable error that is not detected through checking a conventional program status. That is, it may be possible to block an uncorrectable error of data, which is capable of occurring even though the program status is detected as pass.

Figure 2:
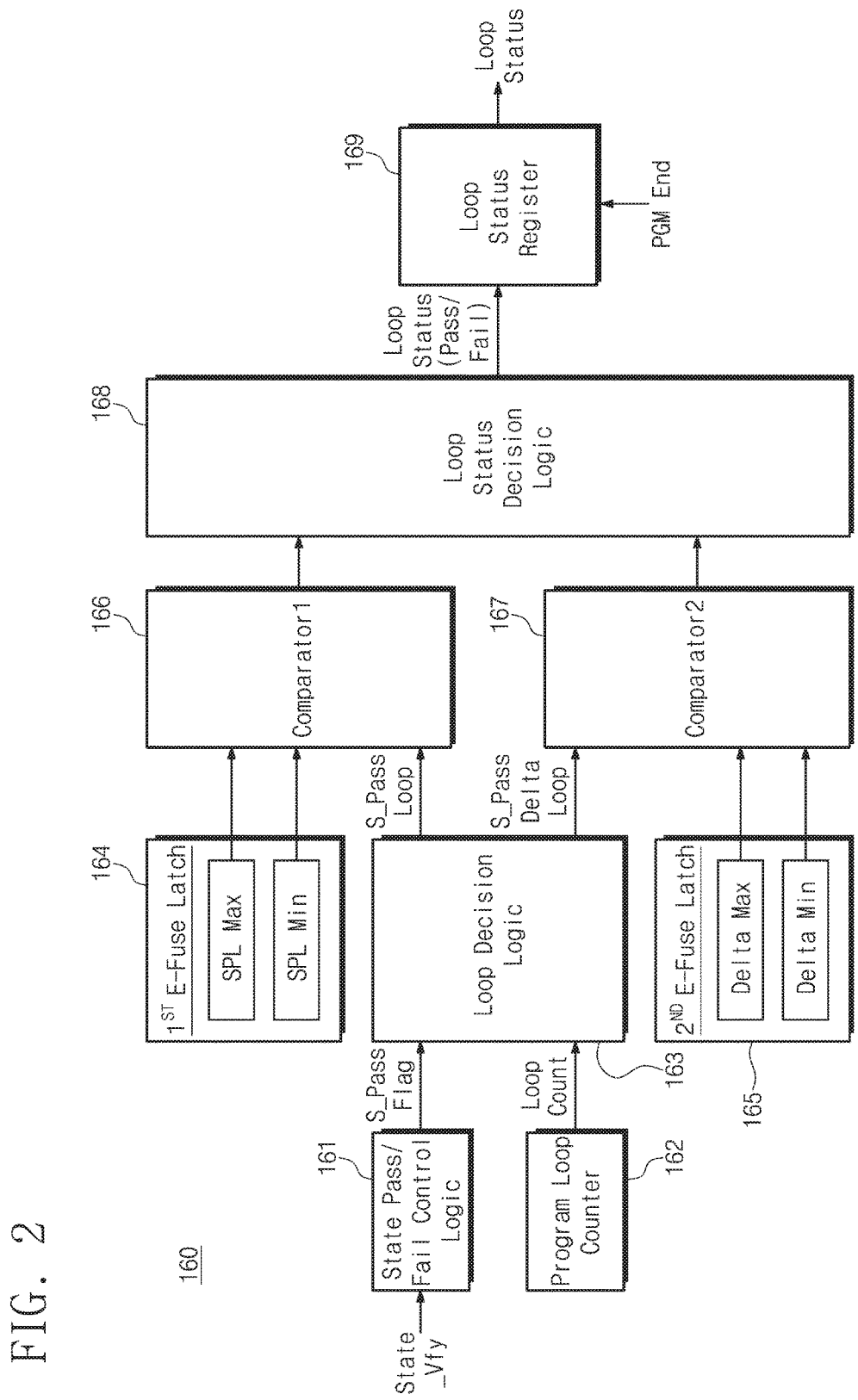
FIG. 2 is a block diagram illustrating a loop status circuit of FIG. 1.

FIG. 2 is a block diagram illustrating a loop status circuit of FIG. 1. Referring to FIG. 2, the loop status circuit 160 may include state pass/fail control logic 161, a program loop counter 162, loop decision logic 163, a first E-fuse latch 164, a second E-fuse latch 165, comparators 166 and 167, loop status decision logic 168, and a loop status register 169. A configuration of the loop status circuit 160 is only one example, and that the loop status circuit 160 is variously modified or changed may be well understood.

The state pass/fail control logic 161 determines whether programming each target state is successful (pass/fail), during a program operation. That is, the state pass/fail control logic 161 detects a program pass time point of each target state with reference to a result State_Vfy of a verification read operation. If each program state is detected as program pass, the state pass/fail control logic 161 outputs a status pass flag S_Pass_Flag. For example, the state pass/fail control logic 161 determines whether selected memory cells are all programmed to a target state (e.g., P2), based on the verification read result State_Vfy. If it is determined that the selected memory cells are all programmed to have a threshold voltage higher than a verification read voltage Vfy2 of the target state P2, the state pass/fail control logic 161 provides the loop status logic 163 with a pass flag P2 Pass Flag of the target state P2. The state pass/fail checking operation may be performed on all target states.

The program loop counter 162 provides the loop decision logic 163 with a loop count value whenever a program loop is executed. The program loop counter 162 sequentially increases a loop count in a program operation or cycle for programming selected memory cells to target states. The program loop counter 162 may provide the loop decision logic 163 with the loop count that sequentially increases from a first loop (e.g., Loop 1) to the last loop (e.g., Loop Max).

The loop decision logic 163 receives the status pass flag S_Pass Flag and the loop count. The loop decision logic 163 generates a state pass loop S_Pass Loop and a state pass delta loop S_Pass Delta Loop with reference to the status pass flag S_Pass Flag and the loop count. The loop decision logic 163 generates a loop count in which programming each target state is completed, as the state pass loop S_Pass Loop. The loop decision logic 163 generates the status pass delta loop S_Pass Delta Loop corresponding to a loop count difference between target states. For example, the loop decision logic 163 may determine if a difference between values of the state pass loops of at least two target states is out of a reference range corresponding to the at least two target states. For example, it is assumed that the loop decision logic 163 receives the status pass flag S_Pass Flag of a target state P1 at a loop count of "7" and receives the status pass flag S_Pass Flag of the target state P2 at a loop count of "9". In this case, the loop decision logic 163 may output "7" as the state pass loop S_Pass Loop (SPL) of the target state P1 and "9" as the state pass loop S_Pass Loop (SPL) of the target state P2. In addition, the loop decision logic 163 may output a state pass loop difference (9−7=2) between the target state P1 and the target state P2, that is, "2" as the status pass delta loop S_Pass Delta Loop. The delta loop may also be referred to, in the present disclosure, as DL. The state pass loop may also be referred to, in the present disclosure, as SPL or state pas sloop (SPL).

Allowable ranges of the state pass loop, which corresponds to each of target states of memory cells, and a delta loop may be stored in the first E-fuse latch 164 and the second E-fuse latch 165, respectively. The allowable range of the state pass loop may also be referred to, in the present disclosure, as the state pass loop reference range or the state pass loop allowable reference range, and the allowable range of the delta loop may also be referred to, in the present disclosure, as the delta loop reference range or the delta loop allowable reference range. According to at least some example embodiments of the inventive concepts, the state pass loop (SPL) of a particular target state is the program loop after which all memory cells that are supposed to be programmed to the particular target state have been programmed of the particular target state.

State pass loops SPL of target states may be stored in the first E-fuse latch 164. The optimal allowable range of a state pass loop SPL of each target state, which is decided in advance, may be stored in the first E-fuse latch 164. If the number of target states P1, P2, P3, P4, P5, P6, and P7 that are needed to detect whether or not of status pass is "7", the number of allowable pass loops needed to program each of the target states P1, P2, P3, P4, P5, P6, and P7 may be stored in the first E-fuse latch 164. The minimum or, alternatively, lower threshold value and the maximum or, alternatively, upper threshold value of the allowable pass loop may be stored in the first E-fuse latch 164 as the minimum or, alternatively, lower threshold value SPL Min of the state pass loop and the maximum or, alternatively, upper threshold value SPL Max of the state pass loop, respectively. If the target states needed to detect whether or not of status pass correspond to some of all target states, only an allowable pass loop range of the some target states may be in advance stored in the first E-fuse latch 164.

An allowable range of a detected status pass delta loop DL may be stored in the second E-fuse latch 165. In the case where a difference in state pass loops SPL between adjacent states is excessively large or small, it may be a need to process a loop status as fail. It is assumed that the number of target states, on which whether or not of status pass is detected, is "7" (P1, P2, P3, P4, P5, P6, and P7). In this case, an allowable range of a delta loop, which is a difference value between state pass loops of the target states P1, P2, P3, P4, P5, P6, and P7, is stored in the second E-fuse latch 165. It is assumed that "2" and "4" are stored as the minimum or, alternatively, lower threshold value Delta Min and the maximum or, alternatively, upper threshold value Delta Max of a range of the delta loop DL between the target states P1 and P2. In this case, if a state pass loop difference between the target states P1 and P2 is smaller than "2" or larger than "4", the loop status may be decided as fail.

The first and second comparators 166 and 167 determine the state pass loop S_Pass Loop and the delta loop detected during the program operation of the nonvolatile memory device 100 are included in an allowable range. To this end, the first comparator 166 is provided with the state pass loop SPL and an allowable range of a desired or, alternatively, predetermined state pass loop stored in the first E-fuse latch 164. The first comparator 166 compares the state pass loop SPL and the allowable range of the desired or, alternatively, predetermined state pass loop. If any one among a plurality of state pass loops is out of the corresponding allowable range, the first comparator 166 may transfer a fail signal to the loop status decision logic 168.

The second comparator 167 compares an allowable range of the delta loop DL stored in the second E-fuse latch 165 and the status pass delta loop S_Pass Delta Loop that the loop decision logic 163 provides. The second comparator 167 decides whether the status pass delta loop S_Pass Delta Loop corresponding to each of the target states is included in the allowable range. If any one among a plurality of status pass delta loops is out of the allowable range, the second comparator 167 may transfer the fail signal to the loop status decision logic 168.

The loop status decision logic 168 decides a loop status with reference to the comparison results from the first and second comparators 166 and 167. For example, if the state pass loop SPL or the status pass delta loop S_Pass Delta Loop is out of the allowable range, the loop status decision logic 168 may decide the loop status as fail.

The loop status register 169 stores the loop status decided by the loop status decision logic 168. The loop status stored in the loop status register 169 may be output to the outside of the nonvolatile memory device 100. For example, the loop status stored in the loop status register 169 may be output in response to a specific status read command or a specific control signal provided from the outside of the nonvolatile memory device 100.

The above-described loop status circuit 160 determines whether programming selected memory cells is successful, for each of target states. That is, when selected memory cells are programmed to target states, if the state pass loop S_Pass Loop corresponding to at least one target state is out of the allowable range, the loop status is decided as fail. In addition, even in the case where the status pass delta loop S_Pass Delta Loop of any one among target states is out of the allowable range, the loop status may be decided as fail.

Figure 3:
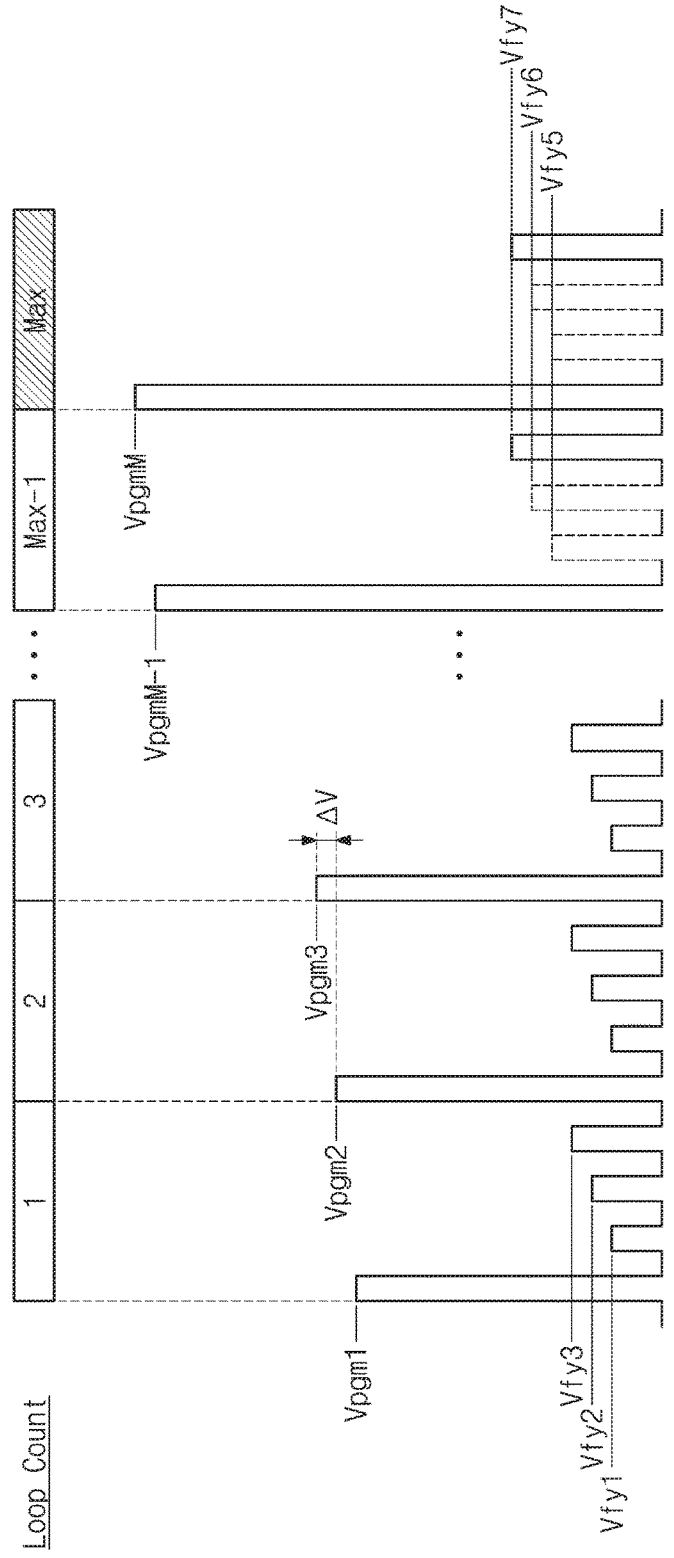
FIG. 3 is a waveform diagram illustrating a loop count and program and verification operations in each loop, according to at least one example embodiment of the inventive concepts.

FIG. 3 is a waveform diagram illustrating a loop count and program and verification operations in each loop, according to at least one example embodiment of the inventive concepts. Referring to FIG. 3, one program cycle is composed of a plurality of program loops. Pulses of a program voltage VpgmN (N being a loop count) and a verification voltage VfyX provided to a word line of selected memory cells may be included in each program loop.

The program voltage VpgmN provided to the selected memory cells is provided as a pulse that has a level increasing as the loop count increases. That is, the program voltage VpgmN may be provided according to the ISPP scheme. According to the ISPP scheme, a pulse train in which the program voltage VpgmN increases by an increment ΔV as the loop count increases may be provided to the word line of the selected memory cells. At least one of verification voltages Vfy1 to Vfy7 that respectively correspond to target states P1 to P7 is applied following each of program voltage pulses Vpgm1 to VpgmM. Applying the program voltage pulse VpgmN and verification voltage pulses is repeated until the maximum or, alternatively, upper threshold loop Max.

If programming is not completed even though the loop count reaches the maximum or, alternatively, upper threshold loop Max in one program cycle, the programming may be decided as fail. According to at least one example embodiment of the inventive concepts, even in the case where each target state or at least one target state is not programmed within a desired or, alternatively, predetermined loop count range, each target state or the at least one target state may be decided as fail. Below, fail occurring when programming is not completed even after the maximum or, alternatively, upper threshold loop Max is referred to as "hard fail", and fail occurring when at least one of target states is decided as pass while being out of a desired or, alternatively, predetermined loop count range is referred to as "soft fail".

An uncorrectable error may occur in the case of the soft fail as well as the hard fail. According to at least some example embodiments of the inventive concepts, for at least a scenario in which the soft fail occurring during the program operation of selected memory cells is detected and processed, it may be possible to markedly reduce occurrence of the uncorrectable error.

Figure 4:
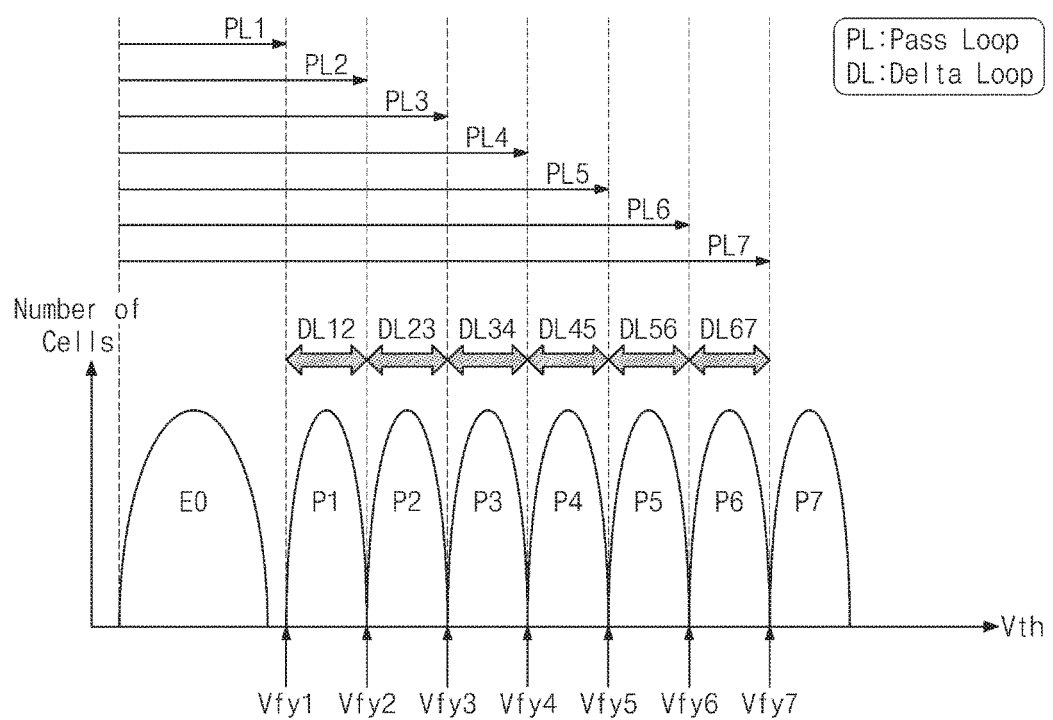
FIG. 4 is a drawing illustrating a pass loop and a delta loop of each target state, according to at least one example embodiment of the inventive concepts.

FIG. 4 is a drawing illustrating a pass loop SPL and a delta loop DL of each target state, according to at least one example embodiment of the inventive concepts. Referring to FIG. 4, a pass loop SPL and a delta loop DL of each target state will be described with reference to triple level cells (TLCs) each having one of an erase state E0 and seven target states P1, P2, P3, P4, P5, P6, and P7.

Each of selected memory cells may have a threshold voltage level corresponding to the erase state E0 for the first time. Each of the selected memory cells may have a threshold voltage belonging to one of the states E0, P1, P2, P3, P4, P5, P6, and P7 as the program operation is executed. Through the program operation, threshold voltages of the selected memory cells may increase from a target state of a low level to a target state of a high level. For example, memory cells that are programmed to the target state P1 may be detected as program pass in a loop count that is smaller than that of the target state P2.

Whether memory cells to be programmed to the target state P1 are successfully programmed may be detected by a verification voltage Vfy1. If the memory cells to be programmed to the target state P1 are successfully programmed is detected by the verification voltage Vfy1, the memory cells may be set to program inhibit, and thus, the memory cells may be released from influence of the program voltage. According to at least one example embodiment of the inventive concepts, it is assumed that the memory cells to be programmed to the target state P1 are completely programmed in a first pass loop PL1.

Whether memory cells to be programmed to the target state P2 higher than the target state P1 are successfully programmed may be detected by a verification voltage Vfy2. If it is detected that the memory cells to be programmed to the target state P2 are successfully programmed, the memory cells may be set to the program inhibit, and thus, the memory cells may be released from influence of the program voltage. It is assumed that the memory cells to be programmed to the target state P2 are completely programmed in a second pass loop PL2.

The first pass loop PL1 and the second pass loop PL2 are consumed to program the memory cells to be programmed to the target states P1 and P2. Likewise, pass loops PL3, PL4, PL5, PL6, and PL7 may be respectively consumed to program memory cells to the target states P3, P4, P5, P6, and P7. A delta loop corresponding to a difference value between pass loops may be decided under the above-described conditions of the pass loops. A delta loop DL12 between the target states P1 and P2 corresponds to a difference value between the first pass loop PL1 and the second pass loop PL2. For example, according to at least some example embodiments of the inventive concepts, if a value (i.e., loop number) of the first pass loop PL1 is "7" and a value (i.e., loop number) of the second pass loop PL2 is "9," a value of delta loop DL12 between the target state P1 and the target state P2 may be "2" (i.e., 9−7=2). Similarly, a delta loop DL23 between the target states P2 and P3 corresponds to a difference value between the second pass loop PL2 and the third pass loop PL3, a delta loop DL34 between the target states P3 and P4 corresponds to a difference value between the third pass loop PL3 and the fourth pass loop PL4, and so on. For example, with the above description, a delta loop DL67 between the target states P6 and P7 corresponds to a difference value between the sixth pass loop PL6 and the seventh pass loop PL7.

A pass loop PL and a delta loop DL corresponding to each of the target states P1, P2, P3, P4, P5, P6, and P7 may be decided to have values of a desired or, alternatively, optimum data reliability, based on the relationship between the target states and the loop counts. The desired or, alternatively, optimum pass loop PL and the desired or, alternatively, optimum delta loop DL may be obtained through a test or a simulation that is made in consideration of various characteristics of the nonvolatile memory device 100. Allowable ranges for providing an appropriate margin may be decided based on the obtained desired or, alternatively, optimum pass and delta loops PL and DL. The decided allowable ranges of the pass and delta loops PL and DL may be respectively stored in the first and second E-fuse latches 164 and 165.

Figure 5:
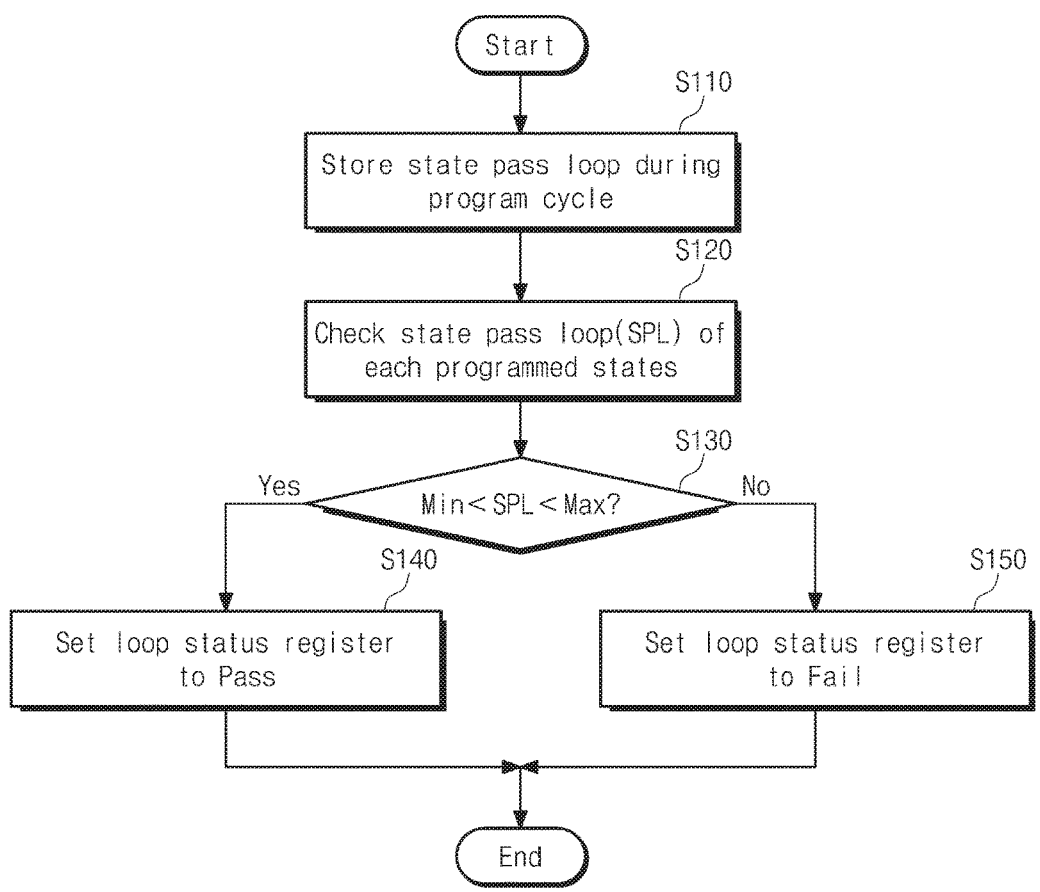
FIG. 5 is a flowchart illustrating a loop status detecting method of the nonvolatile memory device, according to at least one example embodiment of the inventive concepts.

FIG. 5 is a flowchart illustrating a loop status detecting method of the nonvolatile memory device 100, according to at least one example embodiment of the inventive concepts. Referring to FIG. 5, in a program operation, the loop status circuit 160 (refer to FIG. 2) may decide a loop status by using a state pass loop SPL of at least one target state.

In operation S110, the loop status circuit 160 may decide the state pass loop SPL of each target state with reference to a loop count in a program execution operation and a result of a verification read operation. The decided state pass loop SPL may be stored in a memory provided on the inside or outside of the loop status circuit 160.

In operation S120, the loop status circuit 160 may check whether the state pass loop SPL of at least one of target states belongs to a desired or, alternatively, predetermined allowable range. A target state corresponding to a check target of the state pass loop SPL may be decided in various manners based on a characteristic of the nonvolatile memory device 100 or if necessary.

In operation S130, an operation branch may be made according to whether the state pass loop SPL of each target state to be checked belongs to an allowable range defined by the minimum or, alternatively, lower threshold loop count Min and the maximum or, alternatively, upper threshold loop count Max. If it is detected that the state pass loops SPL of all target states to be checked are within the allowable range (Yes), the process proceeds to operation S140. In contrast, if it is detected that the state pass loop SPL of at least one of target states to be checked is out of the allowable range (No), the process proceeds to operation S150.

In operation S140, the loop status circuit 160 may decide that memory cells to be programmed to target states are completely programmed within an allowable loop count range and may decide the loop status as pass. The loop status circuit 160 may set the loop status register 169 to pass.

In operation S150, the loop status circuit 160 may decide the loop status as fail. The loop status circuit 160 may set the loop status register 169 to fail.

An example in which a loop status is decided with reference to the state pass loop SPL of at least one of target states to be checked is described with reference to the flowchart. Even though the program status is decided as pass, it may be possible to detect memory cells that are quickly or slowly programmed abnormally. An uncorrectable error may occur in data read from the cells. Accordingly, it may be possible to detect and block an uncorrectable error in a program procedure through the loop status detecting method according to at least one example embodiment of the inventive concepts.

Figure 6:
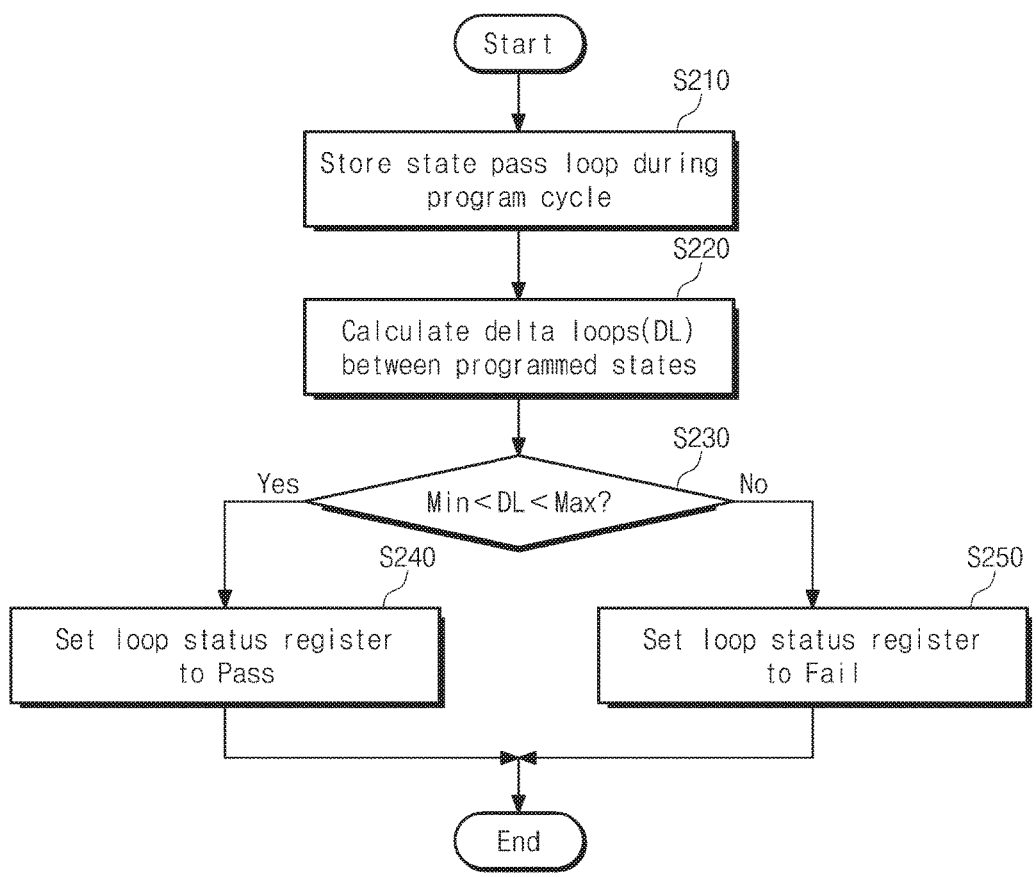
FIG. 6 is a flowchart illustrating a loop status detecting method of the nonvolatile memory device, according to at least another example embodiment of the inventive concepts.

FIG. 6 is a flowchart illustrating a loop status detecting method of the nonvolatile memory device 100, according to at least another example embodiment of the inventive concepts. Referring to FIG. 6, in a program operation, the loop status circuit 160 (refer to FIG. 2) may decide a loop status by using a delta loop DL of at least one target state.

In operation S210, the loop status circuit 160 may decide the state pass loop SPL of each target state with reference to a loop count in a program execution operation and a result of a verification read operation. The decided state pass loop SPL may be stored in an internal or external memory (not illustrated) of the loop status circuit 160.

In operation S220, the loop status circuit 160 may calculate the delta loop DL between target states by using the state pass loop SPL of each target state. The loop status circuit 160 may check whether the calculated delta loop DL belongs to an allowable range. That is, the second comparator 167 may compare the calculated delta loop DL with the minimum or, alternatively, lower threshold loop count Min and the maximum or, alternatively, upper threshold loop count Max of the delta loop DL stored in the second E-fuse latch 165.

In operation S230, an operation branch may be made according to whether the delta loop DL of each target state to be checked belongs to an allowable range defined by the minimum or, alternatively, lower threshold loop count Min and the maximum or, alternatively, upper threshold loop count Max. If it is detected that each of the delta pass loops DL of all target states to be checked is within the corresponding allowable range (Yes), the process proceeds to operation S240. In contrast, if it is detected that the delta loop DL of at least one of target states to be checked is out of the allowable range (No), the process proceeds to operation S250.

In operation S240, the loop status circuit 160 may decide that memory cells to be programmed to target states are completely programmed within an allowable loop count range and may decide the loop status as pass. The loop status circuit 160 may set the loop status register 169 to pass.

In operation S250, the loop status circuit 160 may decide the loop status as fail. The loop status circuit 160 may set the loop status register 169 to fail.

An example in which a loop status is decided with reference to the delta loop DL of at least one of target states to be checked is described above. Accordingly, even though program pass is determined in the maximum or, alternatively, upper threshold loop count Max, it may be possible to detect an error due to memory cells that are programmed between target states relatively quickly or excessively slowly.

Figure 7:
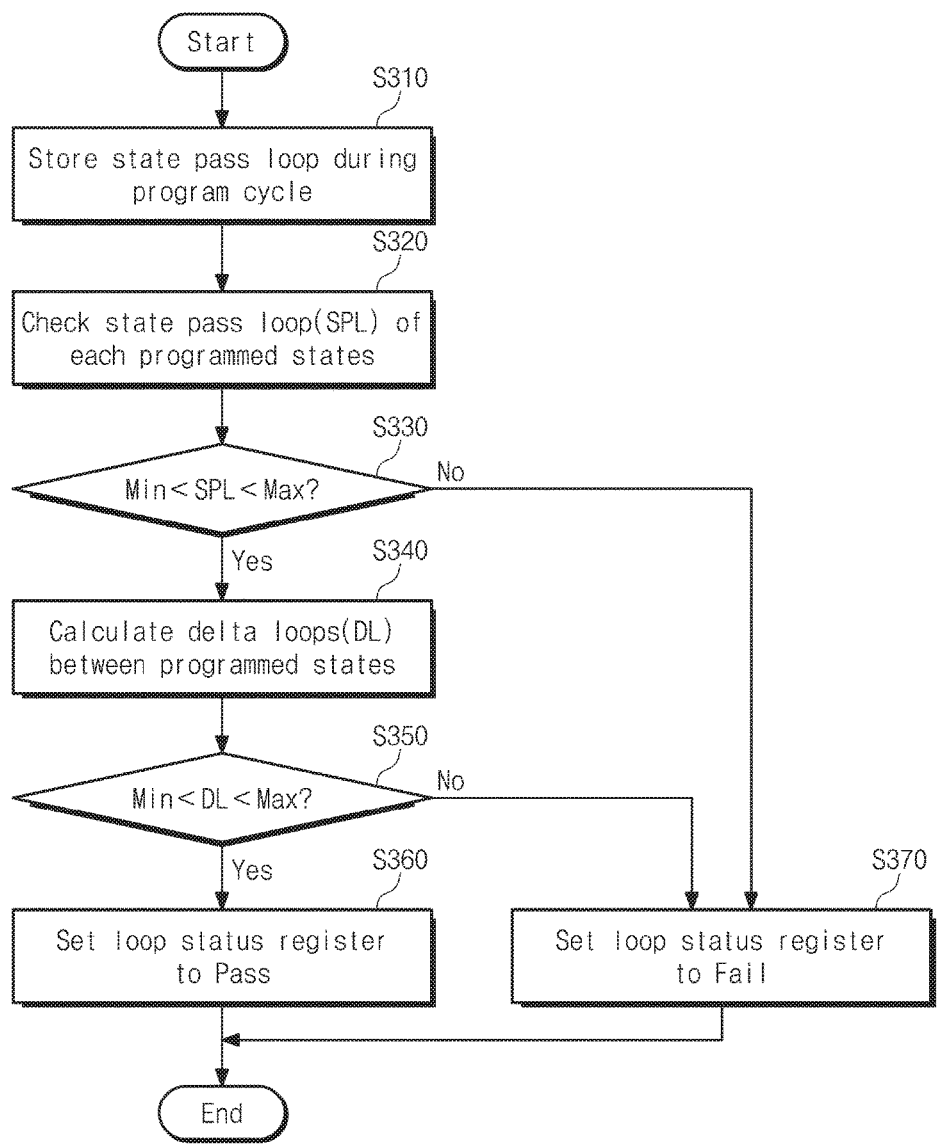
FIG. 7 is a flowchart illustrating a loop status detecting method of the nonvolatile memory device, according to at least another example embodiment of the inventive concepts.

FIG. 7 is a flowchart illustrating a loop status detecting method of the nonvolatile memory device 100, according to at least another example embodiment of the inventive concepts. Referring to FIG. 7, in a program operation, the loop status circuit 160 (refer to FIG. 2) may decide a loop status by using the state pass loop SPL of at least one target state and a delta loop DL of the at least one target state.

In operation S310, the loop status circuit 160 may decide the state pass loop SPL of each target state with reference to a loop count in a program execution operation and a result of a verification read operation. The decided state pass loop SPL may be stored in a memory (not illustrated) provided on the inside or outside of the loop status circuit 160.

In operation S320, the loop status circuit 160 may check whether the state pass loop SPL of at least one of target states belongs to a desired or, alternatively, predetermined allowable range.

In operation S330, an operation branch may be made according to whether the state pass loop SPL of each target state to be checked belongs to an allowable range defined by the minimum or, alternatively, lower threshold loop count Min and the maximum or, alternatively, upper threshold loop count Max. If it is detected that the state pass loops SPL of all target states to be checked are within the allowable range (Yes), the process proceeds to operation S340. In contrast, if it is detected that the state pass loop SPL of at least one of target states to be checked is out of the allowable range (No), the process proceeds to operation S370.

In operation S340, the loop status circuit 160 may calculate the delta loop DL between target states by using the state pass loop SPL of each target state. The loop status circuit 160 may check whether the calculated delta loop DL belongs to an allowable range.

In operation S350, an operation branch may be made according to whether the delta loop DL of each target state to be checked belongs to an allowable range defined by the minimum or, alternatively, lower threshold loop count Min and the maximum or, alternatively, upper threshold loop count Max. If it is detected that each of the delta pass loops DL of all target states to be checked is within the corresponding allowable range (Yes), the process proceeds to operation S360. In contrast, if it is detected that the delta loop DL of at least one of target states to be checked is out of the allowable range (No), the process proceeds to operation S370.

In operation S360, the loop status circuit 160 may decide that memory cells to be programmed to target states are completely programmed within an allowable loop count range and may decide the loop status as pass. The loop status circuit 160 may set the loop status register 169 to pass.

In operation S370, the loop status circuit 160 may decide the loop status as fail. The loop status circuit 160 may set the loop status register 169 to fail.

In the above-described flowchart, a loop status is decided with reference to at least one state pass loop SPL or at least one delta loop DL. Even though a program status is decided as pass during programming selected memory cells, the case where at least one state pass loop SPL or at least one delta loop DL is out of an allowable range may be determined as the soft fail. Accordingly, it may be possible to detect an error due to memory cells that are programmed between target states relatively quickly or excessively slowly. In addition, it may be possible to detect an error due to a noise during a program operation. The case where data are abnormally written due to the noise may be determined as the soft fail. A scheme to process a memory block determined as the soft fail according to at least some example embodiments of the inventive concepts will now be described below.

FIG. 8 is a table illustrating state pass loops SPL and delta loops DL when loop statuses are decided as pass. Referring to FIG. 8, desired or, alternatively, predetermined allowable ranges of the state pass loops SPL and the delta loops DL are respectively stored in the first E-fuse latch 164 and the second E-fuse latch 165.

A program operation is performed, and the state pass loops SPL of the target states P1 to P7 may be decided. The delta loop DL may be generated by calculating a value difference between the state pass loops SPL between two adjacent states. According to at least one example embodiment of the inventive concepts, a value of the state pass loop SPL of the target state P1 is illustrated in FIG. 8 as being "7". A value of the state pass loop SPL of the target state P2 is illustrated in FIG. 8 as being "10", and a value of the state pass loop SPL of the target state P3 is illustrated in FIG. 8 as being "13". Values of the state pass loops SPL of the target state P4 to P7 are illustrated in FIG. 8 as being "16", "19", "22", and "25".

If the state pass loops SPL of the target states P1 to P7 are provided, the delta loops DL that are differences between the state pass loops SPL corresponding to the target states P1 to P7 may be calculated. A difference "3" (10−7=3) between the state pass loops SPL of the target states P1 and P2 may be decided as the delta loop DL of the target states P2. Likewise, a difference "3" between the state pass loops SPL of the target states P2 and P3 may be decided as the delta loop DL of the target states P3. According to the condition of the state pass loops SPL, the delta loop DL of each of the target states P4 to P7 may be calculated to be "3".

A value "7" of the state pass loop SPL of the target state P1 is included in a range from "6" to "8" of the state pass loop SPL stored in the first E-fuse latch 164. Accordingly, the loop status of the target state P1 may be decided as pass. A value "10" of the state pass loop SPL of the target state P2 is included in a range from "9" to "11" of the state pass loop SPL stored in the first E-fuse latch 164. A value "3" of the delta loop DL of the target state P2 is included in a range from "2" to "4" of the delta loop DL stored in the second E-fuse latch 165. Accordingly, the loop status of the target state P2 may be decided as pass.

Likewise, a value "13" of the state pass loop SPL of the target state P3 is included in a range from "12" to "14" of the state pass loop SPL stored in the first E-fuse latch 164. A value "3" of the delta loop DL of the target state P3 is included in a range from "2" to "4" of the delta loop DL stored in the second E-fuse latch 165. Accordingly, the loop status of the target state P3 may be decided as pass. According to the above-described comparison operation, the loop status of each of the remaining target states P4 to P7 may be decided as pass. In the case where a loop status of each target state corresponds to pass, the loop status of a program cycle or a program operation may be decided as pass. Afterwards, the decided loop status may be stored in the loop status register 169.

Values of the state pass loops SPL and the delta loops DL when each loop status corresponds to pass are provided as examples. However, deciding pass or fail of a loop status may not be limited to the above-described condition and may be variously changed.

FIGS. 9A to 9D are tables illustrating state pass loops SPL and delta loops DL when each loop status is decided as fail.

Referring to FIG. 9A, there is illustrated the case where a value of the delta loop DL of the target state P3 is "1". In this case, even though the state pass loop SPL of each of the target states P1 to P7 is within a normal range, the delta loop DL of the target state P3 is out of a range from "2" to "4" of the delta loop DL stored in the second E-fuse latch 165. Accordingly, the loop status of the target state P3 corresponds to fail; if at least one loop status corresponds to fail, the loop status of a program cycle or a program operation may be decided as fail.

Referring to FIG. 9B, there is illustrated the case where a value of the delta loop DL of the target state P3 is "5". In this case, as in that of FIG. 9A, the state pass loop SPL of each of the target states P1 to P7 is included in a normal range. However, since a value of the delta loop DL of the target state P3 is out of an allowable range from "2" to "4" of the delta loop DL stored in the second E-fuse latch 165, the loop status of the target state P3 is decided as fail. Accordingly, the loop status of the program operation may be decided as fail.

Referring to FIG. 9C, there is illustrated the case where a value of the state pass loop SPL of the target state P4 is "14". In this case, even though the delta loop DL of each of the target states P1 to P7 is within a normal range, the state pass loop SPL of the target state P4 is out of a range from "15" to "17" of the state pass loop SPL stored in the first E-fuse latch 164. Accordingly, the loop status of the target state P4 corresponds to fail, and thus, the loop status of the program operation may be decided as fail.

Referring to FIG. 9D, there is illustrated the case where a value of the state pass loop SPL of the target state P4 is "18". In this case, even though the delta loop DL of each of the target states P1 to P7 is within a normal range, the state pass loop SPL of the target state P4 is out of a range from "15" to "17" of the state pass loop SPL stored in the first E-fuse latch 164. Accordingly, the loop status of the target state P4 corresponds to fail, and thus, the loop status of the program operation may be decided as fail.

FIGS. 9A to 9D illustrate examples in which that a loop status of a program operation is decided as fail when the state pass loop SPL or the delta loop DL of any one target state is out of an allowable range. Errors that occur upon performing the program operations illustrated in FIGS. 9A to 9D are errors that are not detected if a loop status of each target state is not checked. Accordingly, it may be possible to detect an uncorrectable error that occurs even though a status of a completed program operation corresponds to pass within a preset program loop range.

Figure 10:
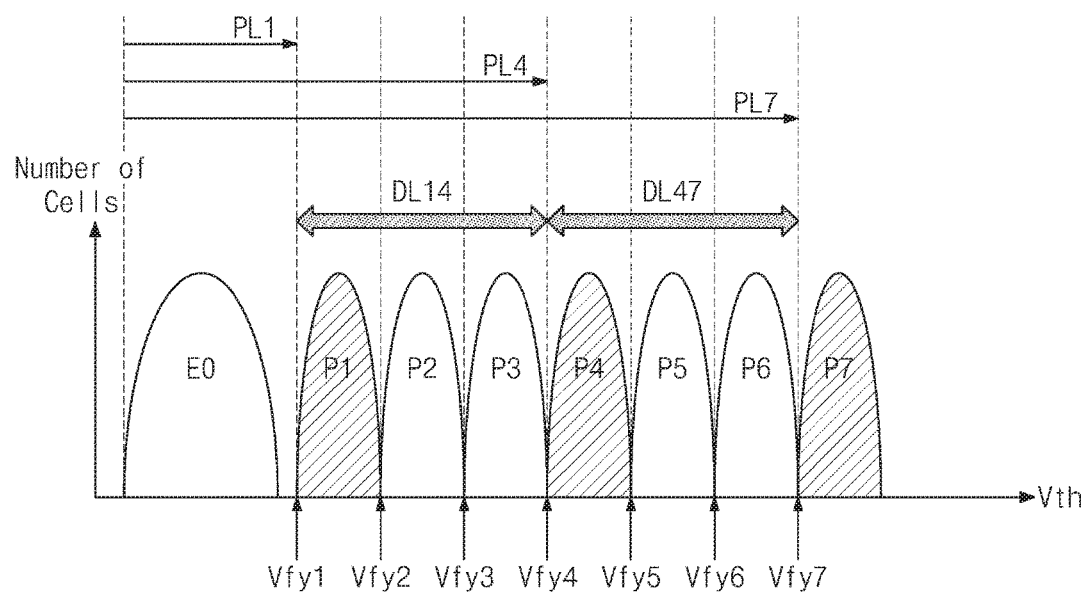
FIG. 10 is a drawing illustrating state pass loops and delta loops of target states, according to at least another example embodiment of the inventive concepts.

FIG. 10 is a drawing illustrating state pass loops and delta loops of target states, according to at least another example embodiment of the inventive concepts. Referring to FIG. 10, according to at least some example embodiments of the inventive concepts, the loop status circuit 160 may be configured to determine whether a program operation is successful, based on values of the state pass loops of some target states from among a plurality of target states (i.e., not all of the plurality of target states). Referring to FIG. 10, pass loops PL and delta loops DL of some target states P1, P4, and P7 may be detected to decide a loop status.

A threshold voltage of each of selected memory cells may be shifted to any one of data states E0, P1, P2, P3, P4, P5, P6, and P7 from the erase state E0 as the program operation is executed. Whether memory cells to be programmed to the target state P1 are successfully programmed may be detected by the verification voltage Vfy1. Whether memory cells to be programmed to the target state P2 higher in a threshold voltage than the target state P1 are successfully programmed may be detected by the verification voltage Vfy2. The first pass loop PL1 and the second pass loop PL2 are consumed to program the memory cells to be programmed to the target states P1 and P2. Likewise, pass loops PL3, PL4, PL5, PL6, and PL7 may be respectively consumed to program memory cells to the target states P3, P4, P5, P6, and P7.

However, only pass loops PL1, PL4, and PL7 corresponding to the target states P1, P4, and P7 may be used to determine a loop status. In addition, delta loops corresponding to differences between the pass loops PL1, PL4, and PL7 may be decided. A delta loop DL14 between the target states P1 and P4 corresponds to a difference value between the first pass loop PL1 and the fourth pass loop PL4. A delta loop DL47 between the target states P4 and P7 corresponds to a difference value between the fourth pass loop PL4 and the seventh pass loop PL7.

The pass loops PL1, PL4, and PL7, which correspond to the target states P1, P4, and P7, and the delta loops DL14 and DL17 may be decided to have values of optimum data reliability. Here, the pass loops PL1, PL4, and PL7 and the delta loops DL14 and DL17 may be used to determine a loop status. Values of the optimum pass loops PL1, PL4, and PL7 and the delta loops DL14 and DL47 may be obtained through a test or a simulation that is made in consideration of various characteristics of the nonvolatile memory device 100. Allowable ranges for providing an appropriate margin may be decided based on the obtained optimum pass loops PL1, PL4, and PL7 and the obtained optimum delta loops DL14 and DL47. The decided allowable ranges of the pass loops PL1, PL4, and PL7 and the delta loops DL14 and DL47 may be respectively stored in the first and second E-fuse latches 164 and 165.

FIG. 11 is a table illustrating a method of deciding a loop status by using the pass loops PL1, PL4, and PL7 and the delta loops DL14 and DL47 of FIG. 10. Referring to FIG. 11, the pass loops PL1, PL4 and PL7 and the delta loops DL14 and DL17 of only some target states P1, P4, and P7 may be used to decide a loop status. The loop status circuit 160 may calculate the pass loops PL1, PL4 and PL7 and the delta loops DL14 and DL17 based on verification read results of the target states P1, P4, and P7 during execution of a program operation.

A value "7" of the state pass loop SPL of the target state P1 is included in a range from "6" to "8" of the state pass loop SPL stored in the first E-fuse latch 164. Accordingly, the loop status of the target state P1 may be decided as pass.

A value "16" of the state pass loop SPL of the target state P4 is included in a range from "15" to "17" of the state pass loop SPL stored in the first E-fuse latch 164. A value "9" of the delta loop DL of the target state P4 is included in a range from "8" to "10" of the delta loop DL stored in the second E-fuse latch 165. Accordingly, the loop status of the target state P4 may be decided as pass.

Likewise, a value "25" of the state pass loop SPL of the target state P7 is included in a range (not less than "24") of the state pass loop SPL stored in the first E-fuse latch 164. A value "9" of the delta loop DL of the target state P7 is included in a range from "8" to "10" of the delta loop DL stored in the second E-fuse latch 165. Accordingly, the loop status of the target state P7 may be decided as pass.

Loop statuses may be all decided as pass by using the pass loops PL1, PL4, and PL7 of the target states P1, P4, and P7 and the delta loops DL14 and DL47. In the case where the loop status of each of the target states P1, P4, and P7 corresponds to pass, the loop status of the program operation may be decided as pass. Afterwards, the decided loop status may be stored in the loop status register 169.

An example in which pass loops and delta loops of some target states are used to decide loop statuses is described above.

Figure 12:
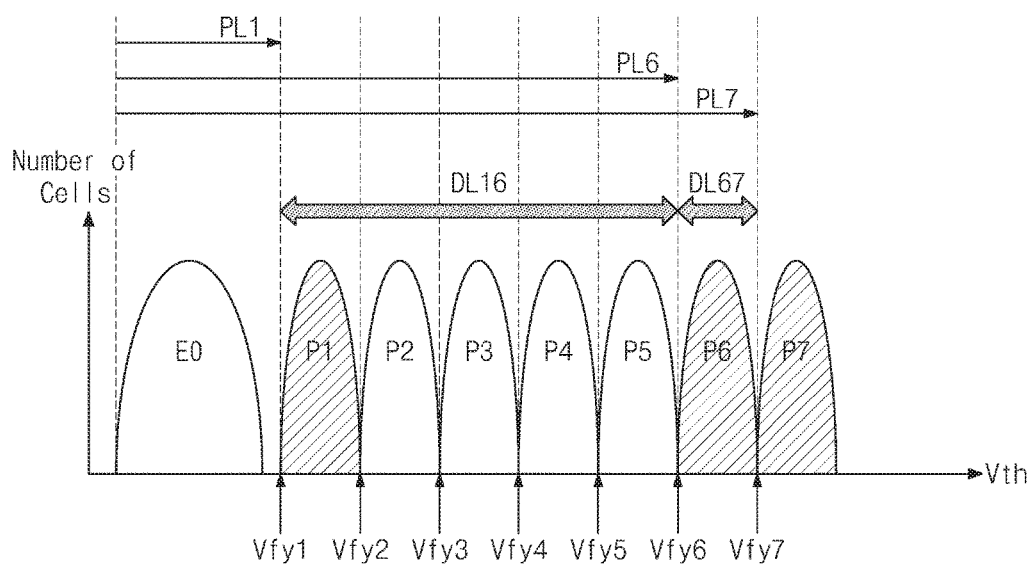
FIG. 12 is a drawing illustrating state pass loops and delta loops of target states for deciding loop statuses, according to at least another example embodiment of the inventive concepts.

FIG. 12 is a drawing illustrating state pass loops SPL and delta loops DL for deciding loop statuses, according to at least another example embodiment of the inventive concepts. Referring to FIG. 12, state pass loops SPL and delta loops DL of some target states P1, P6, and P7 may be detected to decide loop statuses.

A threshold voltage of each of selected memory cells may be shifted to any one of data states E0, P1, P2, P3, P4, P5, P6, and P7 from the erase state E0 as the program operation is executed. Whether the selected memory cells are successfully programmed to target states may be detected by verification voltages Vfy1, Vfy2, Vfy3, Vfy4, Vfy5, Vfy6, and Vfy7. If a loop count of each target state that is program-completed is provided to the loop status circuit 160, pass loops PL1, PL6, and PL7 of the target states P1, P6, and P7 may be decided. In addition, delta loops corresponding to differences between the pass loops PL1, PL6, and PL7 may be decided. A delta loop DL16 between the target states P1 and P6 corresponds to a difference value between the first pass loop PL1 and the sixth pass loop PL6. A delta loop DL67 between the target states P6 and P7 corresponds to a difference value between the sixth pass loop PL6 and the seventh pass loop PL7.

The pass loops PL1, PL6, and PL7, which correspond to the target states P1, P6, and P7, and the delta loops DL16 and DL17 may be decided to have values of optimum data reliability. Here, the pass loops PL1, PL6, and PL7 and the delta loops DL16 and DL17 may be used to determine a loop status. Values of the optimum pass loops PL1, PL6, and PL7 and the optimum delta loops DL16 and DL67 may be obtained through a test or a simulation that is made in consideration of various characteristics of the nonvolatile memory device 100. Allowable ranges for providing an appropriate margin may be decided based on the obtained optimum pass loops PL1, PL6, and PL7 and the obtained optimum delta loops DL16 and DL67. The decided allowable ranges of the pass loops PL1, PL6, and PL7 and the delta loops DL16 and DL67 may be respectively stored in the first and second E-fuse latches 164 and 165.

FIG. 13 is a table illustrating a method of deciding a loop status by using the pass loops PL1, PL6, and PL7 and the delta loops DL16 and DL67 of FIG. 13. Referring to FIG. 13, the pass loops PL1, PL6 and PL7 and the delta loops DL16 and DL17 of only some target states P1, P6, and P7 may be used to decide a loop status. The loop status circuit 160 may calculate the pass loops PL1, PL6 and PL7 and the delta loops DL16 and DL17 based on verification read results of the target states P1, P6, and P7 during execution of a program operation.

A value "7" of the state pass loop SPL of the target state P1 is included in a range from "6" to "8" of the state pass loop SPL stored in the first E-fuse latch 164. Accordingly, the loop status of the target state P1 may be decided as pass.

A value "22" of the state pass loop SPL of the target state P6 is included in a range from "21" to "23" of the state pass loop SPL stored in the first E-fuse latch 164. A value "15" of the delta loop DL of the target state P6 is included in a range from "14" to "16" of the delta loop DL stored in the second E-fuse latch 165. Accordingly, the loop status of the target state P6 may be decided as pass.

Likewise, a value "25" of the state pass loop SPL of the target state P7 is included in a range (not less than "24") of the state pass loop SPL stored in the first E-fuse latch 164. A value "3" of the delta loop DL of the target state P7 is included in a range from "2" to "4" of the delta loop DL stored in the second E-fuse latch 165. Accordingly, the loop status of the target state P7 may be decided as pass.

Loop statuses may be all decided as pass by using the pass loops PL1, PL6, and PL7 of the target states P1, P6, and P7 and the delta loops DL16 and DL67. In the case where the loop status of each of the target states P1, P6, and P7 corresponds to pass, the loop status of the program operation may be decided as pass. Afterwards, the decided loop status may be stored in the loop status register 169.

An example in which pass loops and delta loops of some target states are used to decide loop statuses is described above. Some target states for deciding a loop status may be decided in consideration of the characteristic or performance of the nonvolatile memory device 100.

Figure 14:
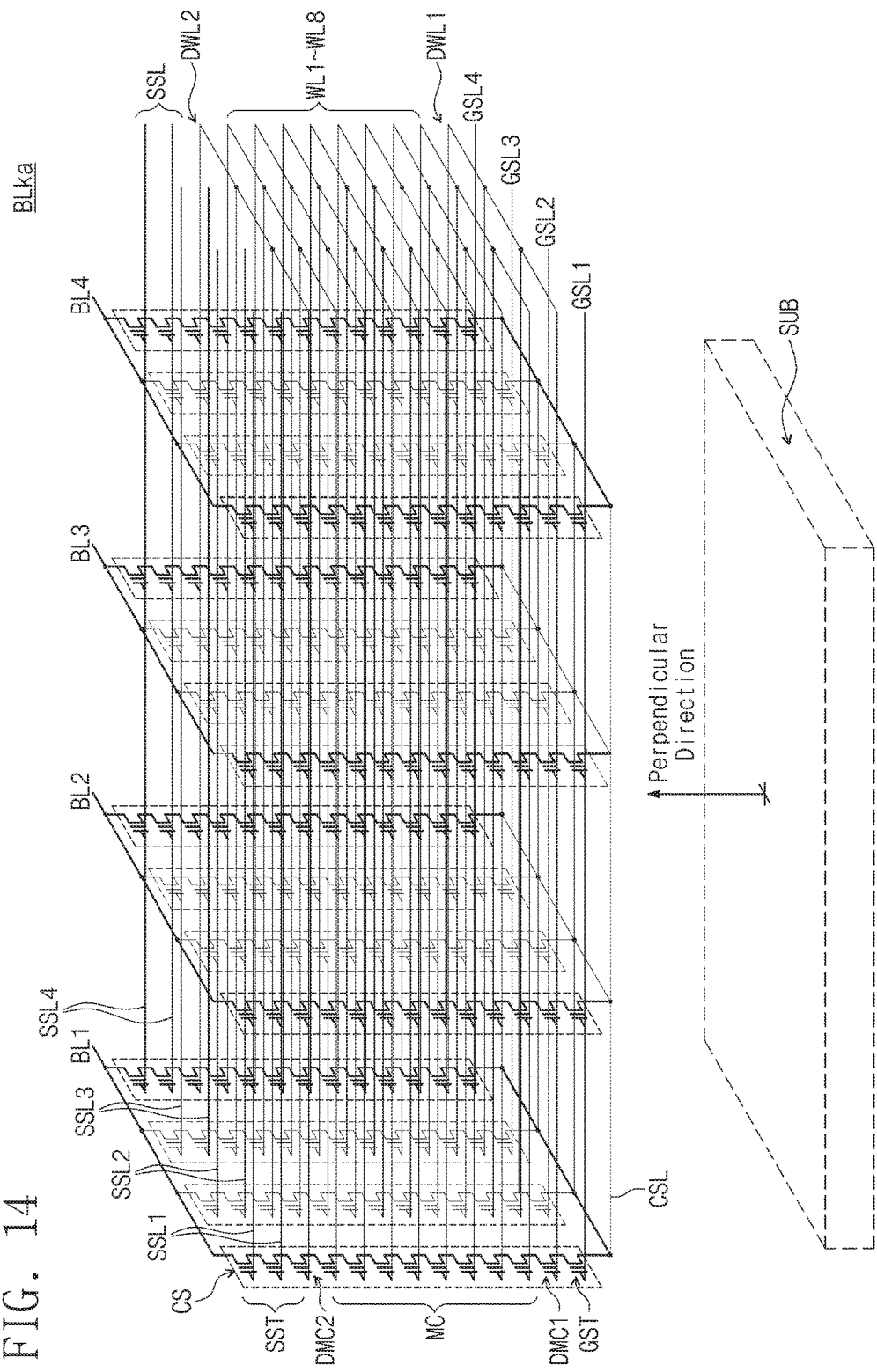
FIG. 14 is a drawing illustrating a structure of a cell array, according to at least one example embodiment of the inventive concepts.

FIG. 14 is a drawing illustrating a structure of a cell array, according to at least one example embodiment of the inventive concepts. Referring to FIGS. 1 and 14, a structure of a memory block BLKa of the cell array 110 is illustrated simply.

A plurality of cell strings CS may be arranged on a substrate SUB in rows and columns. The cell strings CS may be connected in common to a common source line CSL that is formed on (or in) the substrate SUB. A location of the substrate SUB is provided as an example to facilitate understanding of a structure of the memory block BLKa. According to at least one example embodiment of the inventive concepts, a common source line CSL is connected to lower ends of the cell strings CS. However, according to at least some example embodiments of the inventive concepts, the common source line CSL may not be electrically connected to the lower ends of the cell strings CS. At least some example embodiments of the inventive concepts may not be limited to the case that the common source line CSL is physically located at the lower ends of the cell strings CS. According to at least one example embodiment of the inventive concepts, the cell strings CS are arranged in a four-by-four matrix. However, the number of cell strings CS in the memory block BLKa may increase or decrease.

Cell strings of each row may be connected to a corresponding one of first to fourth ground selection lines GSL1 to GSL4 and a corresponding one of first to fourth string selection lines SSL1 to SSL4. Cell strings of each column may be connected to a corresponding one of first to fourth bit lines BL1 to BL4. For ease of illustration, cell strings that are connected to the second and third ground selection lines GSL2 and GSL3 or the second and third string selection lines SSL2 and SSL3 are depicted to be blurry.

Each cell string CS may include at least one ground selection transistor GST connected to a corresponding ground selection line, a first dummy memory cell DMC1 connected to a first dummy word line DWL1, a plurality of memory cells MC respectively connected to a plurality of word lines WL1 to WL8, a second dummy memory cell DMC2 connected to a second dummy word line DWL2, and string selection transistors SST respectively connected to string selection lines SSL. In each cell string CS, the ground selection transistor GST, the first dummy memory cell DMC1, the memory cells MC, the second dummy memory cell DMC2, and the string selection transistors SST may be serially connected to each other along a direction perpendicular to the substrate SUB and may be sequentially stacked along a direction perpendicular to the substrate SUB.

According to at least one example embodiment of the inventive concepts, as illustrated in FIG. 14, one or more dummy memory cells may be arranged between the ground selection transistor GST and the memory cells MC in each cell string CS. In each cell string CS, one or more dummy memory cells may be arranged between the string selection transistors SST and the memory cells MC. In each cell string CS, one or more dummy memory cells may be arranged between the memory cells MC. The dummy memory cells may have the same structure as the memory cells MC and may not be programmed (e.g., program inhibited) or may be programmed differently from the memory cells MC. For example, when memory cells are programmed to form two or more threshold voltage distributions, the dummy memory cells may be programmed to have one threshold voltage distribution range or to have threshold voltage distributions of which the number is less than that of the memory cells MC.

Memory cells of the cell strings CS that are arranged at the same height (or order) from the substrate SUB or the ground selection transistor GST may be electrically connected to each other. Memory cells of the cell strings CS that are arranged at different heights (or orders) from the substrate SUB or the ground selection transistor GST may be electrically separated from each other. FIG. 2 illustrates an example, according to at least one example embodiments of the inventive concepts, in which memory cells of the same height are connected to the same word line. However, the memory cells of the same height may be directly connected to each other in a plane where the memory cells are formed or may be indirectly connected to each other through another layer such as a metal layer.

Memory cells that correspond to a string (or ground) selection line and a word line may constitute a page. A write operation and a read operation may be performed by the page. In each page, each memory cell may store two or more bits. Bits that are written in memory cells belonging to one page may form logical pages. For example, k-th bits that are respectively written in memory cells of each page may form a k-th logical page.

The memory block BLKa may be provided at a three-dimensional (3D) memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In at least one example embodiment of the inventive concepts, the 3D memory array includes vertical NAND strings (or cell strings) that are vertically oriented such that at least one memory cell is located over another memory cell. The at least one memory cell may comprise a charge trap layer. Each vertical NAND string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

According to the cell array 110 of the 3D nonvolatile memory device 100, the degree of integration may be high, but influence of a noise may relatively increase during a program operation. However, in the case of deciding whether a program operation is successful, based on a loop status of each target state (or loop statuses of some target states), it may be possible to reduce an uncorrectable error that occurs due to a noise or a transient error generated in data written in the cell array 110.

Figure 15:
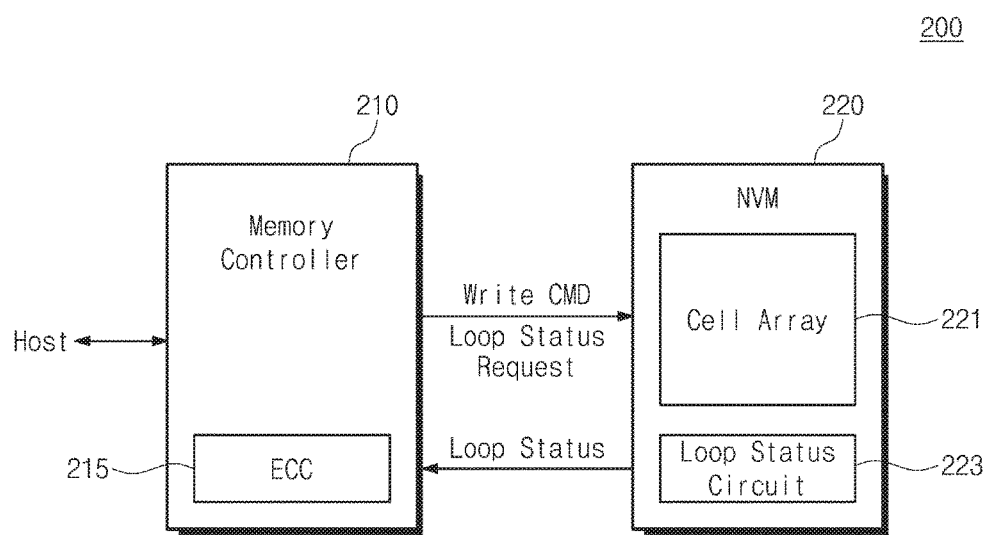
FIG. 15 is a block diagram illustrating a storage device, according to at least one example embodiment of the inventive concepts.

FIG. 15 is a block diagram illustrating a storage device according to at least one example embodiment of the inventive concepts. Referring to FIG. 15, a storage device 200 may include a memory controller 210 and a nonvolatile memory device 220. The memory controller 210 may request the above-described loop status from the nonvolatile memory device 220 when a program operation (or cycle) is completed. The nonvolatile memory device 220 may provide the loop status to the memory controller 210 in response to the request from the memory controller 210. The memory controller 210 may perform various memory management operations based on a value of the loop status from the nonvolatile memory device 220. This will be in more detail described below.

The memory controller 210 controls the nonvolatile memory device 220 in response to a request of a host. The memory controller 210 may provide a write command or write data to the nonvolatile memory device 220 in response to a write request from the host. When the write data are completely programmed, the memory controller 210 may provide the nonvolatile memory device 220 with a loop status request for checking at least one of target states.

The memory controller 210 may perform rewriting of the write data, conversion of address mapping of a memory block, etc. with reference to the loop status from the nonvolatile memory device 220. In particular, when the loop status corresponding to fail is output, the memory controller 210 may read programmed data and may perform error detection. The memory controller 210 may include an error correction block 215 that detects and corrects an error of the read data. When an uncorrectable error is detected from the read data, the memory controller 210 may change address mapping of a selected memory unit (e.g., memory block). The write data may be rewritten in another normal memory block. In addition, the memory controller 210 may process memory blocks, in which a loop status corresponding to fail is detected as a loop status fail of the reference number of times or more, as a bad block such that it is impossible to access or use the memory blocks. In addition, the memory controller 210 may erase and reuse memory blocks in which a loop status corresponding to fail is detected as a loop status fail of less than the reference number of times.

The nonvolatile memory device 220 may include a cell array 221 of a plurality of nonvolatile memory cells and a loop status circuit 223. The cell array 221 and the loop status circuit 223 respectively correspond to the cell array 110 and the loop status circuit 160 of FIG. 1, and a description thereof is thus omitted. The nonvolatile memory device 220 may detect loop statuses of selected target states through the loop status circuit 223 during a program operation. The detected loop statuses may be stored in a loop status register included in the loop status circuit 223. The nonvolatile memory device 220 may output the loop status stored in the loop status register in response to the loop status request from the memory controller 210.

It may be understood that the loop status request and the loop status outputting method are implemented in various schemes between the memory controller 210 and the nonvolatile memory device 220. For example, the loop status request may be provided in the form of a status read command, and the loop status may be output by using a reserved bit(s) of existing status data. However, it may be understood that the loop status request and the loop status outputting method are implemented in the form of various signals or data.

Figure 16A:
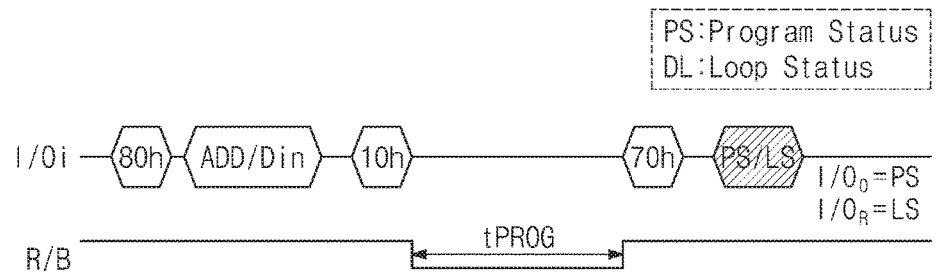
FIGS. 16A to 16C are drawings illustrating an example of a command sequence for sending a loop status between a memory controller and a nonvolatile memory device.
Figure 16B:
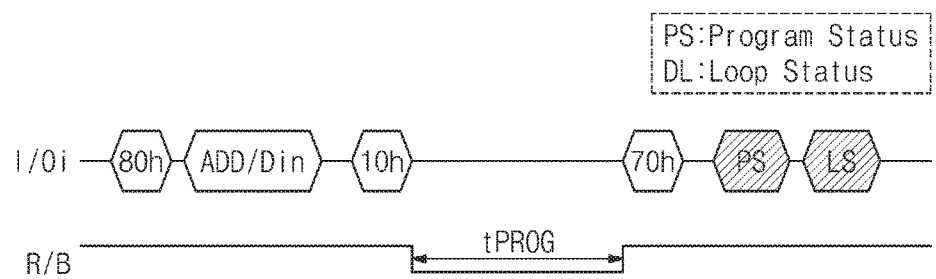
Figure 16C:
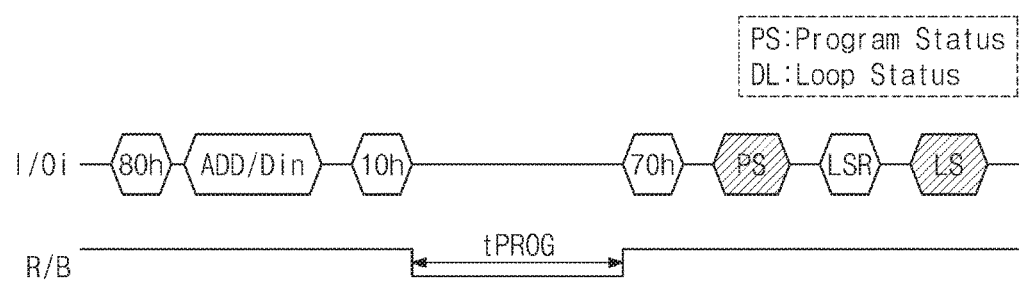

FIGS. 16A to 16C are drawings illustrating an example of a command sequence for sending a loop status between a memory controller and a nonvolatile memory device.

Referring to FIG. 16A, a loop status request may be provided by using a command to request an existing program status (hereinafter referred to as "PS"). First, the memory controller 210 may provide a write command, an address, and data 80h-ADD/Din-10h to the nonvolatile memory device 220. After a confirm command 10h is received, the nonvolatile memory device 220 may program the write data Din in a selected memory area and may output a ready/busy signal R/B of a low level. If programming is completed (after tPROG), the nonvolatile memory device 220 makes the ready/busy signal R/B transition to a high level. In this case, the memory controller 210 may provide a status read command 70h to the nonvolatile memory device 220. The nonvolatile memory device 220 may output a program status PS and a loop status LS to the memory controller 210 in response to the status read command 70h. For example, the nonvolatile memory device 220 may output status data in which a specific bit $I/O_O$ is set to a target state and a reserved bit $I/O_R$ is set to a loop status.

Referring to FIG. 16B, like FIG. 16A, a loop status request may be provided by using a command (e.g., 70h) to request an existing program status PS. However, the nonvolatile memory device 220 may output a program status PS and a loop status LS in separate cycles in response to the status read command 70h, respectively.

Referring to FIG. 16C, a command LSR to request a loop status LS may be defined independently of a command 70h to request a program status PS. If write-requested data is completely programmed (i.e., if tPROG elapses), the nonvolatile memory device 220 makes the ready/busy signal R/B transition to a high level. In this case, the memory controller 210 may provide the command 70h to request the program status PS to the nonvolatile memory device 220. The nonvolatile memory device 220 may output the program status PS to the memory controller 210 in response to the command 70h. In addition, the memory controller 210 may provide the command LSR to request the loop status LS to the nonvolatile memory device 220. The nonvolatile memory device 220 may output the loop status LS through an input/output pin I/Oi in response to the command LSR to request the loop status LS.

How a loop status is transferred between the memory controller 210 and the nonvolatile memory device 220 is described above. However, at least some example embodiments of the inventive concepts may not be limited to the above description. The memory controller 210 may perform an operation for improving integrity of data by using the loop status LS from the nonvolatile memory device 220. For example, the memory controller 210 may perform operations such as error detection, bad block management, and reprogramming.

Figure 17:
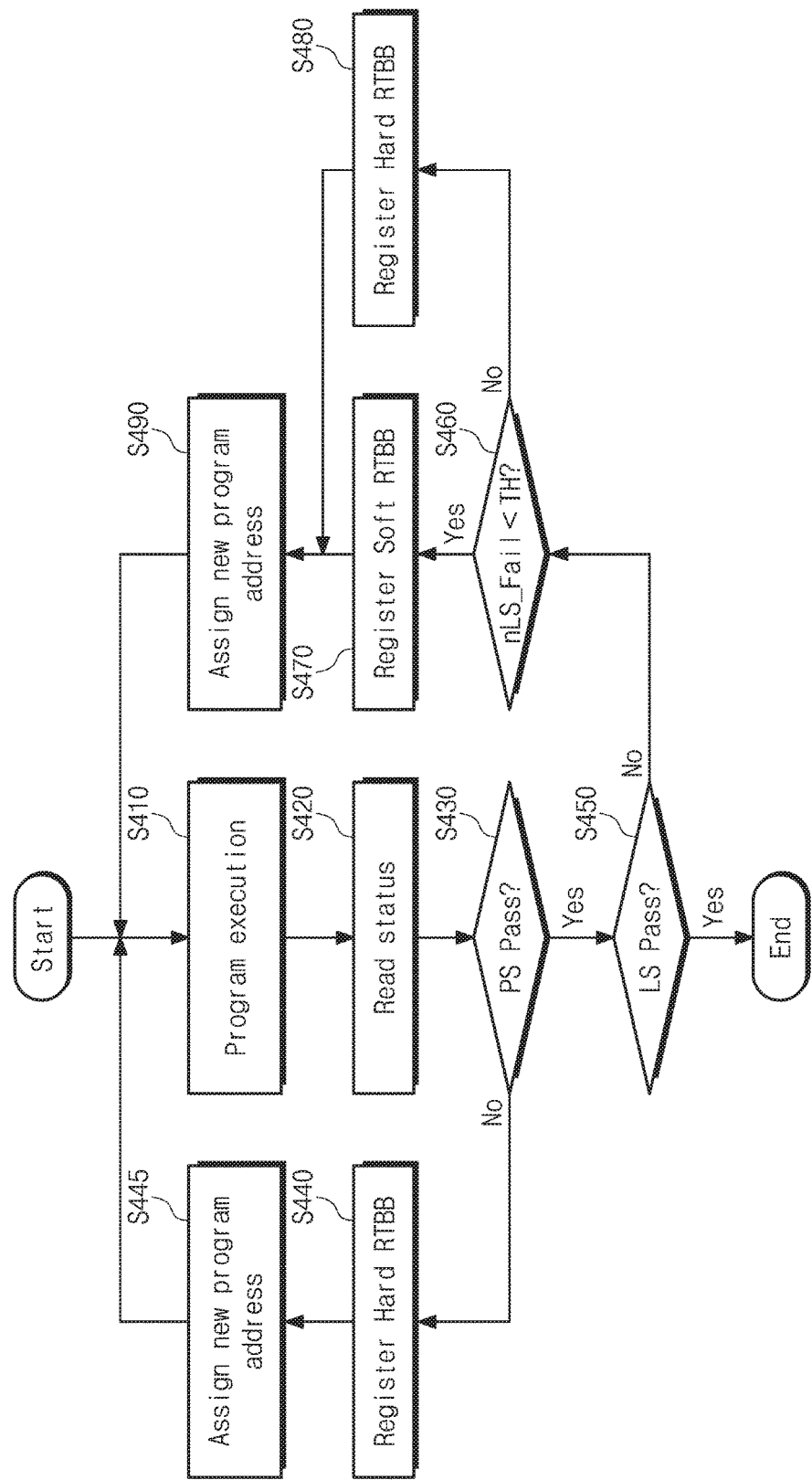
FIG. 17 is a flowchart illustrating a memory managing operation of a storage device, according to at least one example embodiment of the inventive concepts.

FIG. 17 is a flowchart illustrating a memory managing operation of a storage device, according to at least one example embodiment of the inventive concepts. Referring to FIG. 17, the storage device 200 (refer to FIG. 15) may perform a write data reprogramming operation and a bad block processing operation with reference to the loop status LS.

In operation S410, the memory controller 210 may provide a write request to the nonvolatile memory device 220. According to a command sequence, in this case, an address and data may be provided to the nonvolatile memory device 220 together. The nonvolatile memory device 220 may program the data in memory cells selected by the address. The loop status circuit 223 of the nonvolatile memory device 220 may detect whether a value of a pass loop of each target state and a value of a delta loop thereof are respectively included in the corresponding allowable ranges. The loop status circuit 223 may decide a loop status based on whether or not of pass/fail of each target state and may store the loop status in a loop status register (not illustrated).

In operation S420, the memory controller 210 may request a program status PS and a loop status LS from the nonvolatile memory device 220. For example, the memory controller 210 may read the program status PS and the loop status LS from the nonvolatile memory device 220 in a manner described with reference to FIG. 16A, 16B, or 16C.

In operation S430, the memory controller 210 may make operation branch based on the program status PS that the nonvolatile memory device 220 provides. If the program status PS corresponds to fail, the process proceeds to operation S440. In contrast, if the program status PS corresponds to pass, the process proceeds to operation S450. That is, if the selected memory cells are not completely programmed even after the maximum or, alternatively, upper threshold loop, the program status PS may correspond to fail. In this case, the memory controller 210 may perform operation S440 for processing a memory block of which the program status PS is detected as fail.

In operation S440, the memory controller 210 may register the memory block of which the program status PS is detected as fail, as a hard run time bad block (hereinafter referred to as "hard RTBB"). The hard RTBB may be mapped out from an address mapping table such that it is impossible to access the hard RTBB.

In operation S445, the memory controller 210 may select a new memory area for writing write data and may assign a new address to the new memory area. Afterwards, the process returns to operation S410 to write data in the new memory area.

In operation S450, operation branch may be made according to the loop status LS obtained in operation S420. If the loop status LS corresponds to pass (Yes), a program operation of the write data may end. In contrast, if the program status PS corresponds to fail (No), the process proceeds to operation S460.

In operation S460, the memory controller 210 reads the number of times of loop status fail nLS_Fail of a memory block in which a current loop status LS is detected. Loop status check results of memory blocks may be managed in a mapping table (e.g., address mapping table) of the memory controller 210 as a history. If the number of times of loop status fail nLS_Fail of a currently checked memory block (e.g., a total number of times a loop status received by the memory controller 210 indicated a program operation failure with respect to the checked memory block) is smaller than a reference value TH (Yes), the process proceeds to operation S470. However, if the number of times of loop status fail nLS_Fail of the currently checked memory block is not smaller than the reference value TH (No), the process proceeds to operation S480.

In operation S470, the memory controller 210 may register a memory block, of which the number of times of loop status fail nLS_Fail is smaller than the reference value TH, as a soft run time bad block (RTBB). If a memory block is designated as the soft RTBB, data that had been programmed in the memory block may be rewritten in a different memory block. Address mapping may be changed such that the memory block designated as the soft RTBB are erased and reused.

In operation S480, a memory block of which the number of times of loop status fail nLS_Fail is not smaller than the reference value TH may be designated as the hard RTBB. The hard RTBB may be mapped out from an address mapping table such that it is impossible to access the hard RTBB. For example, the memory controller 210 may be configured to set address mapping such that the hard RTBB is mapped out from the address mapping table of the memory controller 210.

In operation S490, the memory controller 210 may assign a new write address for selecting a new memory area for writing write data. Afterwards, the process returns to operation S410 for rewriting the data corresponding to write fail in the new memory block.

Figure 18:
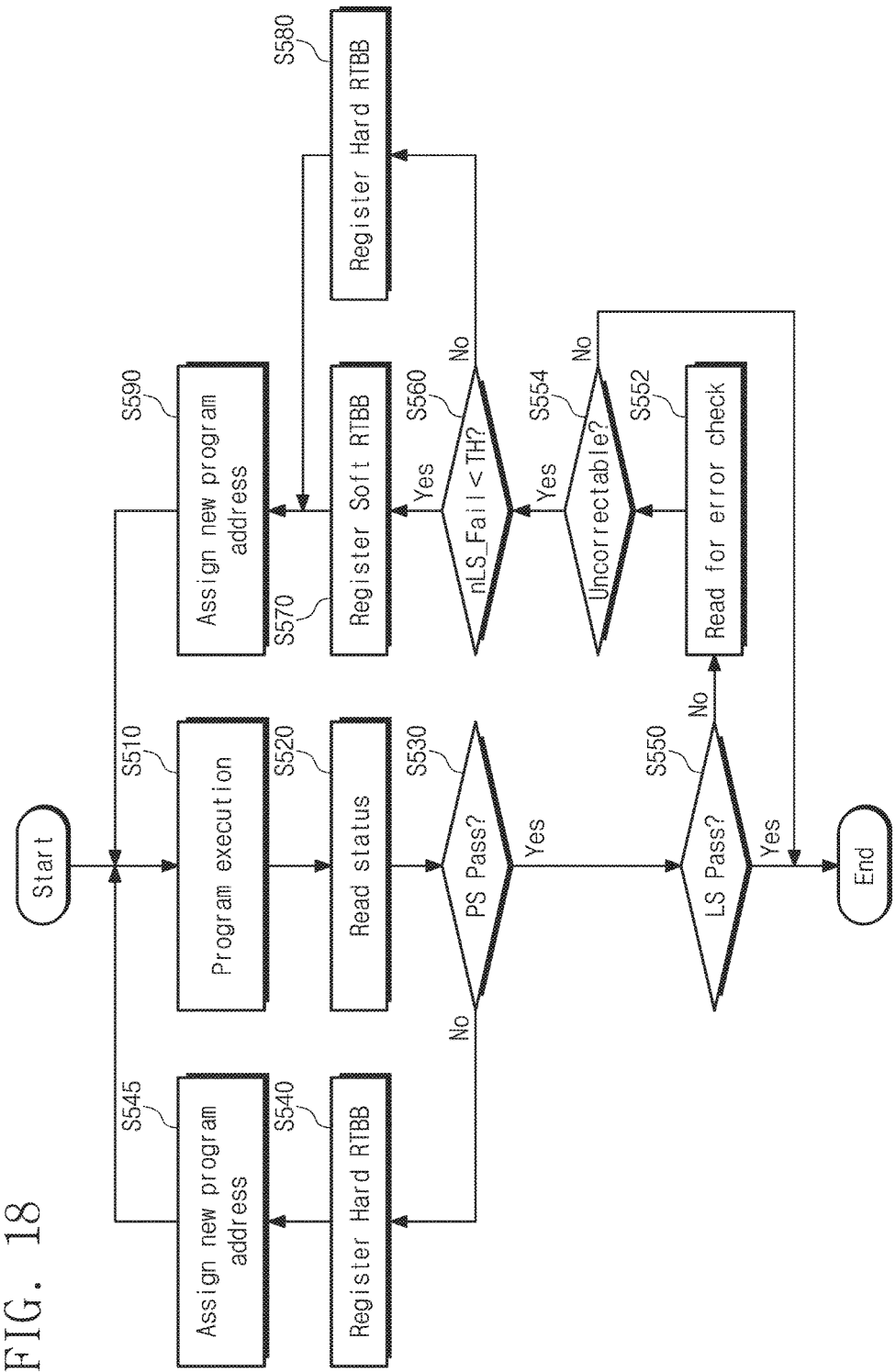
FIG. 18 is a flowchart illustrating a memory managing operation of a storage device, according to at least another example embodiment of the inventive concepts.

FIG. 18 is a flowchart illustrating a memory managing operation of a storage device, according to at least another example embodiment of the inventive concepts. Referring to FIG. 18, the storage device 200 (refer to FIG. 15) may perform operations of reading programmed data and detecting an error of the read data, with reference to the loop status LS. If an uncorrectable error is present in the read data, a write data rewriting operation and a bad block processing operation may be performed. Here, operation S560 to operation S590 are substantially the same as operation S460 to operation S490 of FIG. 17, and a description thereof is thus omitted.

Operation S510 to operation S545 are substantially the same as operation S410 to operation S445 of FIG. 17. In operation S550, operation branch may be made according to the loop status LS. If the loop status LS corresponds to pass (Yes), a program operation of the write data may end. In contrast, if the program status PS corresponds to fail (No), the process proceeds to operation S552.

In operation S552, the memory controller 210 reads write data of which the program status PS is detected as pass but of which the loop status LS is detected as fail. The memory controller 210 reads the selected memory area and detects an error of the read data.

In operation S554, the memory controller 210 may make operation branch based on whether the detected error is correctable. If it is determined that the detected error is correctable, the process may end. In contrast, if it is determined that the detected error is uncorrectable, the process proceeds to operation S560. Procedures for address reassigning for writing the write data in a new memory block and bad block processing may be performed after operation S560. Operation S560 to operation S590 are substantially the same as operation S460 to operation S490 of FIG. 17.

According to the above description, a process of reading programmed data and detecting an error of the read data is additionally performed if the program status PS is detected as pass but the loop status LS is detected as fail. An operation of detecting whether an uncorrectable error exists is additionally performed in addition to operations of detecting the program status PS and the loop status LS. Accordingly, it may be possible to reduce the burden due to mapping processing on an area in which the loop status LS is detected as a fail but an uncorrectable error does not exist.

Figure 19:
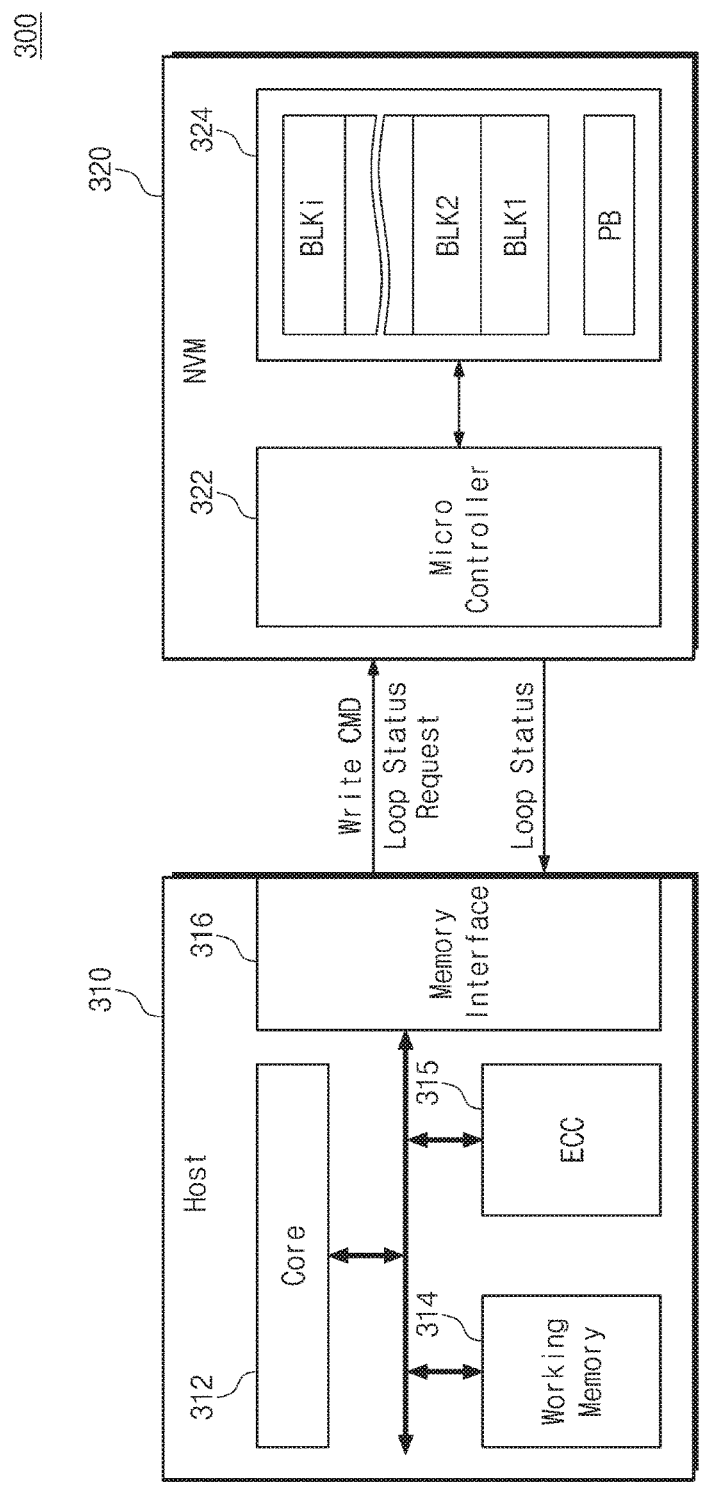
FIG. 19 is a block diagram illustrating a user system, according to at least one example embodiment of the inventive concepts.

FIG. 19 is a block diagram illustrating a user system according to at least one example embodiment of the inventive concepts. Referring to FIG. 19, a user system 300 may include a host 310 and a storage device 320. The host 310 may include a core 312, a working memory 314, an error correction block (ECC) 315, and a memory interface 316. The storage device 320 may include a micro-controller 322 and a nonvolatile memory device 324. Here, the storage device 320 may be implemented with a perfect page new (PPN) device.

The core 312 of the host 310 may execute various application programs loaded on the working memory 314 or may process data loaded to the working memory 414. Software such as an operating system and an application program may be loaded to the working memory 314. In particular, software modules that control mapping of memory blocks or reprogramming of write data by using the program status PS or the loop status LS according to at least one example embodiment of the inventive concepts may be loaded on the operating system in the working memory 314.

The memory interface 316 may convert a memory address access-requested by the core 312 into a physical address. The memory interface 316 may perform, for example, a function of a flash translation layer (FTL).

The storage device 320 may include the micro-controller 322 and the nonvolatile memory device 324. The micro-controller 322 may provide the nonvolatile memory device 324 with a command CMD, an address ADDR, control signals CTRLs, and data from the host 310. The storage device 320 may decide and store a loop status LS of selected memory cells during a program operation. The storage device 320 provides the stored loop status LS to the host 310 in response to a loop status request from the host 310.

According to at least one example embodiment of the inventive concepts, a nonvolatile memory device that generates loop status information for identifying program fail due to an unintended noise during a program operation may be provided. Accordingly, it may be possible to make reliability of data written in the nonvolatile memory device higher.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A nonvolatile memory device comprising:
a cell array including a plurality of memory cells;
a voltage generator configured to provide a program voltage or a verification voltage to a word line of memory cells selected from the plurality of memory cells;
a page buffer configured to transfer write data to be programmed in the selected memory cells through a plurality of bit lines and to sense whether the selected memory cells are programmed to a plurality of target states, based on the verification voltage; and
a control logic configured to control the voltage generator such that, the program voltage and the verification voltage are provided to the word line in units of a plurality of loops during a program operation,
the control logic including a loop status circuit configured to detect values of state pass loops associated with the plurality of target states from a sensing result of the page buffer and determine whether the program operation is successful, based on the values of the state pass loops,
each state pass loop being a program loop, from among the plurality of loops, after which program states of one or more memory cells corresponding to the target state associated with the state pass loop have been raised to the target state associated with the state pass loop.

2. The nonvolatile memory device of claim 1, wherein the loop status circuit is configured such that, if the loop status circuit determines that a value of a state pass loop associated with at least one of the plurality of target states is out of a reference range, the loop status circuit determines that the program operation failed.

3. The nonvolatile memory device of claim 1, wherein the loop status circuit is configured such that, if the loop status circuit determines that a difference between values of the state pass loops associated with at least two target states from among the plurality of target states is out of a reference range corresponding to the at least two target states, the loop status circuit determines that the program operation failed.

4. The nonvolatile memory device of claim 1, wherein the loop status circuit is configured to determine whether the program operation is successful, based on values of the state pass loops associated with some target states from among the plurality of target states.

5. The nonvolatile memory device of claim 1, wherein the loop status circuit is configured to,
determine whether the program operation is successful, based on the values of the state pass loops associated with the plurality of target states, and
output a loop status indicating whether the program operation is successful, in response to a status read command.

6. The nonvolatile memory device of claim 1, wherein the loop status circuit comprises:
loop decision logic configured to, detect values of at least two loops from among the state pass loops by using the sensing result of the page buffer, and calculate a delta loop corresponding to a difference between the values of the at least two loops;

a comparator configured to generate an output based on an allowable reference range and the state pass loops or the delta loop; and loop status decision logic configured to decide whether the program operation is successful, based on the output of the comparator.

7. The nonvolatile memory device of claim 6, wherein the loop status circuit further comprises:

a first E-fuse latch configured to store a state pass loop allowable reference range and provide the state pass loop allowable reference range to the comparator; and a second E-fuse latch configured to store a delta loop allowable reference range and to provide the delta loop allowable reference range to the comparator.

8. The nonvolatile memory device of claim 7, wherein at least one of the state pass loop allowable reference range and the delta loop allowable reference range has an offset that is adjustable according to, a location of the word line, a location or an erase count of a memory block in which the selected memory cells are included, or a driving temperature of the nonvolatile memory device.

9. The nonvolatile memory device of claim 7, wherein the state pass loop allowable reference range and the delta loop allowable reference range that are respectively stored in the first E-fuse latch and the second E-fuse latch are set by using a set feature from the outside of the nonvolatile memory device.

10. The nonvolatile memory device of claim 7, wherein the loop status circuit further comprises:

a loop status register configured to store a loop status indicating whether the program operation is successful.

11. A storage device comprising:

a nonvolatile memory device configured to, detect values of state pass loops associated with a plurality of target states, and determine a loop status by using the values of the state pass loops, each state pass loop including at least one program voltage pulse and at least one verification voltage pulse, the loop status indicating whether a program operation of selected memory cells is successful; and a memory controller configured to reassign an address of data programmed in the selected memory cells to another address based on the determined loop status.

12. The storage device of claim 11, wherein the nonvolatile memory device is configured to provide the loop status to the memory controller based on a status read command.

13. The storage device of claim 11, wherein the memory controller is configured to designate a memory block, in which the selected memory cells are included, as a soft run time bad block or a hard run time bad block, based on a number of times of loop status fail of the memory block.

14. The storage device of claim 13, wherein the memory controller is configured to set address mapping such that, a memory block designated as the soft run time bad block is erased and reused, and a memory block designated as the hard run time bad block is mapped out from an address mapping table of the storage device.

15. The storage device of claim 11, wherein the memory controller is configured such that, if the loop status indicates that the program operation failed, the memory controller reads data programmed in the selected memory cells and detects whether an uncorrectable error is present in the read data.

16. A nonvolatile memory device comprising:

a control logic configured to perform a program operation, the program operation including, raising program states of one or more nonvolatile memory cells of a nonvolatile memory cell array to a target state by applying one or more program loops to the one or more nonvolatile memory cells, determining a state pass loop of the target state, the state pass loop being a program loop, from among the one or more program loops, after which program states of the one or more nonvolatile memory cells have been raised to the target state, and determining whether the program operation failed based on the state pass loop and a first range.

17. The nonvolatile memory device of claim 16, wherein the control logic is configured to determine that the program operation failed when the control logic determines that a value of the state pass loop is outside the first range.

18. The nonvolatile memory device of claim 17, wherein the control logic is configured to perform the program operation based on an incremental step pulse programming (ISPP) scheme.

19. The nonvolatile memory device of claim 16 further comprising:

the nonvolatile memory cell array.

20. The nonvolatile memory device of claim 19, wherein the control logic is configured to determine that the program operation failed when the control logic determines that a value of the state pass loop is outside the first range.

* * * * *